US009688801B2

(12) United States Patent
Fukutani et al.

(10) Patent No.: US 9,688,801 B2
(45) Date of Patent: Jun. 27, 2017

(54) VINYL POLYMER POWDER, CURABLE RESIN COMPOSITION AND CURED SUBSTANCE

(75) Inventors: Kaori Fukutani, Otake (JP); Toshihiro Kasai, Otake (JP)

(73) Assignee: MITSUBISHI RAYON CO., LTD., Tokyo (JP)

( * ) Notice: Subject to any disclaimer, the term of this patent is extended or adjusted under 35 U.S.C. 154(b) by 141 days.

(21) Appl. No.: 13/148,138

(22) PCT Filed: Feb. 4, 2010

(86) PCT No.: PCT/JP2010/051575
§ 371 (c)(1),
(2), (4) Date: Aug. 5, 2011

(87) PCT Pub. No.: WO2010/090246
PCT Pub. Date: Aug. 12, 2010

(65) Prior Publication Data
US 2011/0294954 A1    Dec. 1, 2011

(30) Foreign Application Priority Data

Feb. 5, 2009 (JP) .................................. 2009-024751
Aug. 24, 2009 (JP) .................................. 2009-193366

(51) Int. Cl.
*C08F 265/06* (2006.01)
*C08F 2/22* (2006.01)
*C08F 2/24* (2006.01)
*C08F 4/00* (2006.01)
*C08J 3/12* (2006.01)
*C08L 63/00* (2006.01)
*C08L 51/00* (2006.01)
*C08L 33/06* (2006.01)
*C08L 33/14* (2006.01)
*C08L 57/00* (2006.01)
*H01L 23/29* (2006.01)
*C08J 5/18* (2006.01)
*C08G 59/50* (2006.01)
*C09D 163/00* (2006.01)
*C08L 51/06* (2006.01)

(52) U.S. Cl.
CPC ............. *C08F 265/06* (2013.01); *C08F 2/22* (2013.01); *C08L 33/06* (2013.01); *C08L 33/14* (2013.01); *C08L 51/00* (2013.01); *C08L 63/00* (2013.01); *C09D 163/00* (2013.01); *C08L 51/06* (2013.01); *H01L 2924/0002* (2013.01)

(58) Field of Classification Search
CPC ... C09D 163/00–163/10; C09D 133/06; C09D 133/14; C08L 63/00–63/10; C08L 33/06; C08L 33/14; C09J 163/00–163/10; C09J 133/06; C09J 133/14; C08F 2/22; C08F 265/06

USPC .................................................... 525/902, 65
See application file for complete search history.

(56) References Cited

U.S. PATENT DOCUMENTS

| | | | |
|---|---|---|---|
| 5,290,857 A * | 3/1994 | Ashida et al. ................... 525/65 |
| 5,441,994 A * | 8/1995 | Moriga et al. ................ 523/201 |
| 5,476,884 A * | 12/1995 | Kayaba et al. ............... 523/443 |
| 5,677,053 A * | 10/1997 | Moriga et al. ................ 428/347 |
| 5,972,272 A * | 10/1999 | Nagase et al. ................ 264/324 |
| 6,020,435 A * | 2/2000 | Blankenship et al. ........ 525/256 |
| 6,037,392 A * | 3/2000 | Tang et al. .................... 523/201 |
| 6,180,693 B1 * | 1/2001 | Tang et al. .................... 523/201 |
| 6,288,174 B1 * | 9/2001 | Ikegami et al. ............... 525/301 |
| 6,433,048 B2 * | 8/2002 | Kasai ............................ 524/244 |
| 6,841,622 B2 * | 1/2005 | Kasai ............................ 525/222 |
| 7,041,715 B2 * | 5/2006 | Saiki et al. .................... 523/201 |
| 2004/0147668 A1 | 7/2004 | Miyake et al. |
| 2007/0251419 A1 * | 11/2007 | Yamaguchi et al. ..... 106/287.13 |
| 2008/0274357 A1 * | 11/2008 | Kasai et al. ................... 428/407 |
| 2010/0022691 A1 * | 1/2010 | Katsuchi et al. ............. 524/100 |

FOREIGN PATENT DOCUMENTS

| | | | | |
|---|---|---|---|---|
| JP | 2000313818 A | * | 11/2000 | ............. C08L 101/16 |
| JP | 2003049050 A | * | 2/2003 | ............. C08L 63/00 |
| JP | 2003-252912 | | 9/2003 | |
| JP | 2003252912 A | * | 9/2003 | ............... C08F 2/06 |
| JP | 2004 224846 | | 8/2004 | |
| JP | 2004 238432 | | 8/2004 | |

(Continued)

OTHER PUBLICATIONS

Machine translation of JP 2000313818 A.*
Machine translation of JP 2003049050 A.*
Excerpt of Basic Physical Properties of Common Solvents, Knovel Critical Tables, 2$^{nd}$ Edition (2008).*
David Wright, Environmental Stress Cracking of Plastics, Rapra Technology (1996).*
Machine translation of JP 2003-252912 A.*
George Wypych, Handbook of Solvents, 2nd ed., vol. 1—Properties, pp. 119-137 (2014).*

(Continued)

*Primary Examiner* — Kregg Brooks
(74) *Attorney, Agent, or Firm* — Oblon, McClelland, Maier & Neustadt, L.L.P.

(57) ABSTRACT

Disclosed is a vinyl polymer powder which is superior to dispersibility to curable resin compositions, which immediately gives a gel state for curable resin compositions by short-time heating with predetermined temperature, which is with high ion concentration, and which is useful as a pre-gel agent suitable for fields of electronic materials, to provide a curable resin composition comprising the vinyl polymer powder, and to provide a cured substance of the curable resin composition. The vinyl polymer powder of the present invention has an acetone-soluble component of 30% by mass or more, mass average molecular weight of the acetone-soluble component of 100,000 or more, a content of an alkali metal ion of 10 ppm or less, and a volume average primary particle size (Dv) of 200 nm or more.

6 Claims, No Drawings

(56) References Cited

FOREIGN PATENT DOCUMENTS

| JP | 2004-331845 | 11/2004 |
|---|---|---|
| JP | 2005 232411 | 9/2005 |
| JP | 2007 277529 | 10/2007 |
| JP | 2007262331 A * | 10/2007 |
| JP | 2008239769 A * | 10/2008 |

OTHER PUBLICATIONS

Machine translation of JP 2007-262331 A.*
Resolution Performance Products, Epikote 828 Product Data Sheet (2004) ("Epikote").*
International Search Report issued Apr. 6, 2010 in PCT/JP10/51575 filed Feb. 4, 2010.
Communication Pursuant to Rule 114(2) EPC issued Aug. 1, 2014, in Application No. / Patent No. 10738577.5-1302 / 2395032.
Mikio Konno, "Synthesis of Monodisperse Polymer Particles in Soap-free Emulsion Polymerization", Journal of the Society of Rubber Industry, vol. 79, Feb. 2006, pp. 61-66 (with English Abstract).

* cited by examiner

VINYL POLYMER POWDER, CURABLE RESIN COMPOSITION AND CURED SUBSTANCE

CROSS-REFERENCE TO RELATED APPLICATIONS

This application is a National Stage of PCT/JP2010/051575 filed on Feb. 4, 2010. This application is based upon and claims the benefit of priority to Japanese Application No. 2009-024751 filed on Feb. 5, 2009, and to Japanese Application No. 2009-193366 filed on Aug. 24, 2009, the entire contents of which are incorporated herein by reference.

BACKGROUND OF THE INVENTION

Technical Field

The present invention relates to a vinyl polymer powder, a curable resin composition comprising the vinyl polymer powder and a cured substance of the curable resin composition.

Background Art

Resin materials used in fields of electronics are considered as important with improvement of technologies of IT such as mobile devices, digital appliances, communication devices, and electronic devices for vehicles.

For example, there is rapidly increased demand for thermosetting resins or active energy-ray curable resins, such as epoxy resins, polyimide resins, curable acrylic resins, and curable oxetanic resins, superior in heat resistance or insulating properties.

In particular, resin compositions comprising epoxy resins have high glass transition temperature and are excellent in insulating properties, flame retardant properties, and adhesiveness, so that resin compositions comprising epoxy resins are used for various fields such as sealing materials of semiconductors, insulating materials, and adhesives.

Above all, fluidal epoxy resins at room temperature are used for various paste type or film type materials because of applicability of use for casting or coating.

Specifically, they are used for various applications such as fluidal sealants like primary-mounting under-filling materials, secondary-mounting under-filling materials and globtop materials in wire bonding; sealing sheets to seal various tips on boards in the lump; pre-dispensing type under-filling materials; sealing sheets to collectively seal on a wafer level; adhesion layers for three layer-copper-clad laminates; adhesion layers for die bond films, diagram touch films, layer-insulation films, cover-lay film, and the like; adherent pastes such as die bond pastes, layer-insulation pastes, conductive pastes and anisotropic conductive pastes; sealants for light emitting diodes; optical adhesives; and sealing materials of various flat panel displays like a crystalline liquid and an organic electroluminescence.

In recent years, it becomes important that the above epoxy resin compositions can be applied for fine processing such as precise injection or coating by a dispenser, precise pattern-coating by screen-printing, and coating on films with high film thickness-precision.

For the above applications, it is important that these epoxy resin compositions are stable for viscosity characteristics and conspicuous lowering or rising of the viscosity by environmental temperature is fatal.

However, viscosities conspicuously decrease by rising of temperature before curing because epoxy resin compositions have much time for hardening and much dependency of viscosity on temperature, so that highly precise coating or pattern formation is difficult.

For example, it is necessary having high flowability of epoxy resin compositions to pour epoxy resin compositions into slits having dozens of micrometers using dispensers, when epoxy resin compositions are used as under-filling materials.

However, when flowability of epoxy resin compositions are high, viscosity at heating of epoxy resin compositions are lowered before curing and epoxy resin compositions begin to flow, so that a damage such as contamination of board or circuit, near the pouring portion, or restraint of basic sealing performance is generated.

In addition, when epoxy resin compositions are used as adhesives for films such as copper-clad laminates and die bonding films, it may occur a problem that film thickness of the adhesives fluctuates because epoxy resin compositions flow out by severe lowering of viscosities of epoxy resin compositions, in the case of heat hardening of coating with arranging to constant film thickness at room temperature.

Thus, in fields of especially electronic materials, there is an extremely strong demand that a viscosity of epoxy resin composition to be used should not deteriorate when a temperature of the epoxy resin composition is raised and that a form should be early stabilized, by a request for highly precise processing rising year by year.

Method to give such the characteristics to an epoxy resin composition includes a method to blend a rubbery particle suitable for an agent for imparting gelation characteristics (hereinafter referred to as "a pre-gel agent") to immediately obtain a gel state of an epoxy resin composition by heating.

However, the rubbery particle is insufficient for ability to give gelation characteristics and fusion between particles is strong because of lowness of glass transition temperature, so that it is difficult to disperse in primary particles in a liquid material such as an epoxy resin.

In addition, there is not especially considered ion purity (ion concentration) of rubbery particles.

As a demand for epoxy resin compositions in fields of recent electronic materials, not only obtaining of simple gelation characteristics but also high ion purity (namely, low ion concentration) to reduce influence to electrical characteristics, high permeability with immediate permeation into a narrow pitch, and extremely short-time gelation speed are required at the same time.

Up to the present, materials satisfying these requirements were not proposed.

For example, in patent document 1, a method to use a vinyl polymer particle as a pre-gel agent is proposed.

In this approach, gelation characteristics can be given to an epoxy resin composition.

However, there cannot be obtained satisfaction for support to tendency for finer pitch or thinner thickness, required in fields of electronic materials because dispersibility to primary particles of the vinyl polymer particle is not sufficient.

In addition, a granular structure is generated to give an inferior quality when the epoxy resin composition is thinly coated on a base film.

Also, there is not considered ion concentration of the epoxy resin composition.

In patent document 2, a method to use an ion cross-linked rubbery particle as a pre-gel agent is proposed.

In this approach, ions are inevitably contaminated in a cured substance obtained because gelation characteristics is given by ionic cross linking, so that this method is unsuitable for fields of electronic materials.

Of course, gelation characteristics cannot be given because ionic cross-linking may not be obtained when ion concentration of an epoxy resin composition is intended lowered.

CITATION LIST

Patent Literature

Patent literature 1: Japanese Patent Laid-Open No. 2003-49,050
Patent literature 2: Japanese Patent Laid-Open No. Hei 11-129,368

SUMMARY OF INVENTION

Technical Problem

The purposes of the present invention are to provide a vinyl polymer powder which is superior to dispersibility to curable resin compositions, which immediately gives a gel state for curable resin compositions by short-time heating with predetermined temperature, which is with high ion concentration, and which is useful as a pre-gel agent suitable for fields of electronic materials, to provide a curable resin composition comprising the vinyl polymer powder, and to provide a cured substance of the curable resin composition.

Solution to Problem

The subject matter of the present invention is the first invention which is a vinyl polymer powder (hereinafter referred to as "the present powder") having an acetone-soluble component of 30% by mass or more, mass average molecular weight (hereinafter referred to as "Mw") of the acetone-soluble component of 100,000 or more, a content of an alkali metal ion of 10 ppm or less, and a volume average primary particle size (Dv) of 200 nm or more.

In addition, the subject matter of the present invention is the second invention which is a curable resin composition (hereinafter referred to as "the present resin composition") comprising the present powder and a curable resin.

Also, the subject matter of the present invention is the third invention which is a cured substance (hereinafter referred to as "the present cured substance") obtained by curing of the present resin composition.

Advantageous Effects of Invention

The present resin composition has high gelating faculty by short-time heating with predetermined temperature.

In addition, the present cured substance has low ion concentration.

Also, a vinyl polymer (hereinafter referred to as "the present polymer") forming the present powder in the present cured substance has excellent dispersibility.

Thus, the present powder, the present resin composition and the present cured substance are suitable for fields of electronic materials where highly precise processing corresponding to tendency for finer pitch or thinner thickness, of recent electronic devices is required.

DESCRIPTION OF EMBODIMENTS

The present powder has an acetone-soluble component of 30% by mass or more, Mw of the acetone-soluble component of 100,000 or more, a content of an alkali metal ion of 10 ppm or less, and a volume average primary particle size (Dv) of 200 nm or more.

When the acetone-soluble component of the present powder is 30% by mass or more, sufficient gelation characteristics to the present resin composition can be obtained, and flowing of an epoxy resin may be restrained at high temperature.

In addition, the acetone-soluble component of the present powder is preferably 40% by mass or more, more preferably 50% by mass or more, and further more preferably 80% by mass or more, from the viewpoint that highly gelation characteristics can be obtained even when viscosities of epoxy resins mentioned later are extremely low.

In particular, the present powder can be used for wider applications as the acetone-soluble component is more because it is required that high gelation characteristics can be given with a few amounts of the present powder in the applications in which the curable resin composition is used with low viscosity.

In the present invention, the acetone-soluble component refers to the value obtained by the measuring method mentioned later.

When Mw of the acetone-soluble component of the present powder is 100,000 or more, high gelation characteristics can be given with a few amounts of the present powder, and the flow of the epoxy resin can be restrained at the high temperature.

In addition, Mw of the acetone-soluble component of the present powder is preferably 20,000,000 or less from the viewpoint that solubility to the epoxy resin is not lowered and a sufficient gel state can be obtained in a short time.

Mw of the acetone-soluble component of the present powder is preferably 400,000 or more, more preferably 600,000 or more, further more preferably 800,000 or more, and the most preferably 1,000,000 or more from the viewpoint that high gelation characteristics can be obtained even when viscosity of the epoxy resin mentioned later is extremely low.

In addition, Mw of the acetone-soluble component of the present powder is more preferably 10,000,000 or less, and further more preferably 5,000,000 or less from the viewpoint that an effective gel state at a predetermined temperature can be obtained.

In the present invention, gel state can be evaluated by gelation temperature and gelation performance, which are obtained by measuring methods mentioned later.

In addition, in the present invention, Mw refers to the value obtained by the measuring method of Mw mentioned later.

When the content of the alkali metal ion in the present powder is 10 ppm or less, excellent insulating-characteristics of the present cured substance can be obtained.

The content of the alkali metal ion in the present powder is preferably 5 ppm or less, and more preferably 1 ppm or less.

The present resin composition is used for various applications, but high electrical characteristics are required in an application that the present resin composition directly touches a semiconductor wafer.

In addition, presence of a little ionic impurity may cause inferior insulation with a tendency to thinner thickness of electronic devices.

Thus, the present powder can be used for wide applications when the content of the alkali metal ion is within the above extent.

In addition, the present powder can be also used for applications requiring much amounts of a pre-gel agent.

In the present invention, the content of the alkali metal ion in the present powder shows the total contents of Na ion and K ion, and refers to the value obtained by the measuring method of the content of the alkali metal ion mentioned later.

The volume average primary particle size (Dv) of the present powder is 200 nm or more, and is preferably 500 nm or more.

Usually, the powder obtained by a method such as a spray-drying method or a wet coagulation method is a coagulation powder that many primary particles aggregated.

However, when volume average primary particle size (Dv) is 200 nm or more, dispersibility of the present powder in the case of compounding to curable resins such as fluidal epoxy resins becomes excellent because the above coagulation powder is easy to be dispersed with the state of primary particles.

In addition, when volume average primary particle size (Dv) is 200 nm or more, there is an advantage that viscosity of the present resin composition is not easy to rise because the total surface area of particles can be lowered enough.

In addition, the volume average primary particle size (Dv) of the present powder is preferably 8 μm or less, more preferably 5 μm or less, and further more preferably 1 μm or less, from the viewpoint that support to tendency for finer pitch or thinner thickness is possible.

For the present powder, properties and a structure as the powder is not limited.

For example, a coagulation powder (the secondary particle) by aggregation of many primary particles obtained by polymerization may be formed, or a further higher-order structure may be formed.

However, in the case of such the coagulation powder, it is preferable that primary particles do not bind strongly and aggregate loosely.

Thereby, primary particles are dispersed finely and uniformly in a curable resin.

In addition, the present powder having few particles with a small volume average primary particle size (Dv) is preferable and the present powder having excellent mono-dispersibility is preferable from the viewpoint of excellent dispersibility of the present powder in the curable resin.

In the present invention, the mono-dispersibility of the present powder is shown by a ratio (Dv/Dn) of the volume average primary particle size (Dv) to a number average primary particle size (Dn) of the present powder.

The Dv/Dn of the present powder is preferably 3.0 or less, more preferably 2.0 or less, and further more preferably 1.5 or less.

As mono-dispersibility of the present powder is higher (the Dv/Dn is nearer to 1), there is a tendency that gelation of the present resin composition proceeds rapidly in a short time, and coexistence with the storage stability of the present resin composition becomes easy.

A content of sulfate ion ($SO_4^{2-}$) in the present powder is preferably 20 ppm or less.

The curable resin composition to be used for electronic materials is applied in environment contacting with substances such as metal wires like copper and aluminum, and a circuit trace, so that metallic corrosion is caused when sulfate ion remains and then poor conduction and malfunction may be caused.

The present powder can be used for wide applications when the content of sulfate ion in the present powder is 20 ppm or less.

In the present invention, the content of sulfate ion in the present powder refers to the value obtained by a measuring method of the content of sulfate ion mentioned later.

When a vinyl monomer is polymerized by an emulsion polymerization and a suspension polymerization to obtain the present polymer, compounds such as sulfuric acid esters and sulfonic acid type compounds as well as sulfuric acid salts may be used.

Sulfonic acid ion, sulfinic acid ion, or sulfate ester ions contained in the above compounds may cause metallic corrosion.

Thus, in the polymerization of the vinyl monomer, it is preferable to reduce using amounts of compounds such as sulfate esters and sulfonic acid type compounds.

The present polymer is obtained by polymerization of a radical polymerizable vinyl monomer (herein after referred to "the present monomer").

For a method of polymerization of the present polymer, an emulsion polymerization, a soap-free emulsion polymerization, a swelling polymerization, a mini-emulsion polymerization, a dispersion polymerization and a micro suspension polymerization are preferable from the viewpoints of easiness of obtaining of a spherical particle and controlling of morphology of a particle.

In the above methods, a soap-free emulsion polymerization is more preferable from the viewpoint that a polymer with the particle size having excellent dispersibility and supporting tendency of finer pitch may be obtained.

For the present polymer, a spherical particle is preferable from the viewpoint that viscosity of the present resin composition increases and the present resin composition is superior in fluidity.

There is not particularly limited the internal morphology of the present polymer (the primary particle).

The present polymer may have various particulate morphologies, such as a core shell structure and a gradient structure, which are generally recognized, even when various factors such as a polymer composition, molecular mass, glass transition temperature, and a solubility parameter are homogeneous.

The present polymer preferably has a concentric circle-shaped morphology having two phases or more, which is known as a core-shell structure.

For a method to control an internal morphology of the present polymer, a method to form a multi-layered structure in which solubility parameter or molecular weight is different from the inside of the particle and the outside of the particle, is included.

The above method is preferable from the viewpoint of coexistence of storage stability (pot life) and gelation speed, of the present resin composition.

Example of a method, having high industrial practicability, to control an internal morphology of the present polymer includes a method of proceeding of consecutive titration polymerization by multi-stages with different constitutional vinyl monomer mixtures.

Example of a judging method whether or not the present polymer has a core shell structure includes a method of confirming of simultaneous satisfaction of the fact that there certainly grows a particle size of a polymer particle obtained by sampling in a polymerization process and the fact that there changes minimum film forming temperature (MFT) or solubility to various solvents of a polymer particle obtained by sampling in polymerization process.

In addition, there is included a method of confirming of presence of a concentric circle-shaped morphology by observing a slice of the present polymer using a transmission electron microscopy (TEM) or a method of confirming of presence of a concentric circle-shaped morphology by observing a slice of the present polymer broken with freezing using a scanning electron microscopy (Cryo-SEM).

The present powder can be produced by a spray-drying of an emulsion of the present polymer obtained by emulsion polymerization of the present monomer.

When the present monomer is used for emulsion polymerization, a polymerization initiator and an emulsifier are used.

For the polymerization initiator, at least one selected from ammonium persulfate and azo compounds are preferable.

For the emulsifier, at least one selected from ammonium salt type anionic emulsifiers and nonionic emulsifiers are preferable.

In addition, emulsion polymerization with two stages or more for different constitutional vinyl monomer mixtures is preferable from the viewpoint of controlling of the internal morphology of the present polymer.

The present monomer is not limited as the present monomer is a radical polymerizable vinyl monomer.

Examples of the present monomer include (meth)acrylates such as methyl(meth)acrylate, ethyl(meth)acrylate, n-propyl(meth)acrylate, propyl(meth)acrylate, n-butyl (meth)acrylate, t-butyl(meth)acrylate, i-butyl(meth)acrylate, n-hexyl(meth)acrylate, n-octyl(meth)acrylate, 2-ethylhexyl (meth)acrylate, cyclohexyl(meth)acrylate, benzyl (meth) acrylate, phenyl(meth)acrylate, nonyl(meth)acrylate, decyl (meth)acrylate, dodecyl(meth)acrylate, stearyl(meth)acrylate, t-butylcyclohexyl(meth)acrylate, isobornyl(meth)acrylate, tricyclo[5.2.1.0$^{2.6}$]decane-8-yl-methacrylate, and dicyclopentadienyl (meth)acrylate; vinyl cyanides such as (meth)acrylonitrile; aromatic vinyl monomers such as styrene, α-methyl styrene, and vinyl toluene; (meth)acrylates containing functional groups such as 2-hydroxyethyl (meth) acrylate, 2-hydroxypropyl(meth)acrylate, 4-hydroxybutyl (meth)acrylate, glycerol mono(meth)acrylate, glycidyl (meth)acrylate, N,N-dimethylamino ethyl(meth)acrylate, and N-methyl-2,2,6,6-tetramethylpiperidyl(meth)acrylate; acrylic acids such as (meth)acrylic acid, crotonic acid, itaconic acid, fumaric acid, and maleic acid; (meth)acryl amide; vinyl monomers such as vinylpyridine, vinyl alcohol, vinylimidazole, vinylpyrrolidone, vinyl acetate, and 1-vinylimidazole; itaconates such as monomethyl itaconate, monoethyl itaconate, mono propyl itaconate, monobutyl itaconate, dimethyl itaconate, diethyl itaconate, dipropyl itaconate, and dibutyl itaconate; fumarates such as monomethyl fumarate, monoethyl fumarate, mono propyl fumarate, monobutyl fumarate, dimethyl fumarate, diethyl fumarate, dipropyl fumarate, and dibutyl fumarate; and maleates such as monomethyl malate, monoethyl malate, mono propyl malate, monobutyl malate, dimethyl malate, diethyl malate, dipropyl malate, and dibutyl malate.

These monomers can be used alone or in combination.

In the above monomers, (meth)acrylates, (meth)acrylates containing functional groups, and acrylic acids are preferable from the viewpoint of easiness of radical polymerization and emulsion polymerization.

It is noted that it is preferable not to use monomers containing a halogen atom such as vinyl chloride and vinylidene chloride because they may cause metallic corrosion.

When the present monomer is sequentially polymerized with two stages, it is preferable to use (meth)acrylates for the first-step polymerization, and to use (meth)acrylates, (meth) acrylates containing functional groups and acrylic acids for the second-step polymerization from the viewpoint of properties of the present polymer.

When the present monomer is sequentially polymerized in three stages or more, it is preferable to use (meth)acrylates for polymerization of the inner layer, and to use (meth) acrylates, (meth)acrylates containing functional groups and acrylic acids for polymerization of the outermost layer, from the viewpoint of properties of the present polymer.

It is noted that (meth)acrylate shows acrylate or methacrylate in the present invention.

When the present monomer is polymerized, a polymerization initiator, an emulsifier, a dispersion stabilizer, and a chain transfer agent can be used.

Examples of the polymerization initiator include persulfates such as potassium persulfate, sodium persulfate, and ammonium persulfate; oil soluble azo compounds such as azobisisobutyronitrile, 2,2'-azobis (2-methyl buthyronitrile), 2,2'-azobis(2,4-dimethyl valerontrile), 2,2'-azobis(4-methoxy-2,4-dimethyl valeronitrile), 1,1'-azobis (cyclohexane-1-carbonitrile), and dimethyl 2,2'-azobis-(2-methyl propionate); water soluble azo compounds such as 4,4'-azobis(4-cyano valeric acid), 2,2'-azobis {2-methyl-N-[1,1-bis(hydroxymethyl)-2-hydroxyethyl]propionamide}, 2,2'-azobis{2-methyl-N-[2-(2-hydroxyethyl)]propionamide}, 2,2'-azobis{2-methyl-N-[2-(1-hydroxybutyl)]propionamide}, 2,2'-azobis[2-(5-methyl-2-imidazoline-2-yl)propane] or the salts, 2,2'-azobis[2-(2-imidazoline-2-yl)propane] or the salts, 2,2'-azobis[2-(3,4,5,6-tetrahydropyrimidine-2-yl)propane] or the salts, 2,2'-azobis{2-[1-(2-hydroxy ethyl)-2-imidazoline-2-yl]propane} or the salts, 2,2'-azobis(2-methyl propione amidine) or the salts, 2,2'-azobis(2-methyl propine amidine) or the salts, 2,2'-azobis[N-(2-carboxyethyl)-2-methyl propione amidine] or the salts; and organic peroxides such as benzoyl peroxide, cumene hydroperoxide, t-butyl hydroperoxide, t-butyl peroxy-2-ethyl hexanoate, t-butyl peroxyisobutyrate, lauroylperoxide, propyl benzene hydroperoxide, p-menthane hydroperoxide, and 1,1,3,3-tetramethylbutyl peroxy-2-ethyl hexanoate.

The polymerization initiator can be used alone or in combination.

In the above polymerization initiators, polymerization initiators without containing alkali metal ions are preferable, and ammonium persulfate and azo compounds are more preferable.

In addition, it is further more preferable using azo compounds without containing chloride ions together with ammonium persulfate from the viewpoint that the content of sulfate ion ($SO_4^{2-}$) in the present powder can be reduced.

In addition, without departing from object of the invention, there can be used redox initiators which are combinations of reducing agents such as sodium formaldehyde sulphoxylate, L-ascorbic acid, fructose, dextrose, sorbose and inositol; ferrous sulfate; ethylenediamine tetraacetic acid disodium salt; and peroxides.

Examples of the emulsifier include anionic emulsifiers, cationic emulsifiers, nonionic emulsifiers, betaine type emulsifiers, polymer emulsifiers and reactive emulsifiers.

Examples of the anionic emulsifier include alkylsulfonate salts such as sodium alkylsulfonate; alkyl sulfate salts such as sodium lauryl sulfate, lauryl ammonium sulfate, and lauryl triethanolamine sulfate; alkylphosphate ester salts such as potassium polyoxyethylene alkylphosphate; alkyl benzene sulfonates such as sodium alkylbenzene sulfonate, sodium dodecylbenzenesulfonate, and sodium alkyl naphthaleneesulfonate; and dialkyl sulfosuccinates such as sodium dialkyl sulfosuccinate and ammonium dialkyl sulfosuccinate.

Examples of the cationic emulsifier include alkyl amine salts such as stearylamine acetate, coconut amine acetate, tetradecylamine acetate, and octadecylamine acetates; and quaternary ammonium salts such as lauryltrimethylammonium chloride, stearyl trimethylammonium chloride, cetyltrimethylammonium chloride, distearyldimethylammonium chloride, and alkyl benzyl methylammonium chloride.

Examples of the nonionic emulsifier include sorbitan fatty acid esters such as sorbitan monolaurate, sorbitan monopalmitate, sorbitan monostearate, sorbitan tristearate, sorbitan monooleate, sorbitan trioleate, sorbitan monocaprylate, sorbitan monomyristate, and sorbitan monobehenate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, and polyoxyethylene sorbitan triisostearate; polyoxyethylene sorbitol fatty acid esters such as polyoxyethylene sorbitol tetraoleate; Polyoxyethylene alkyl ethers such as polyoxyethylene lauryl ether, polyoxyethylene cetyl diethyl ether, polyoxyethylene stearyl diethyl ether, polyoxyethylene oleyl diethyl ether, and polyoxyethylene myristyl diethyl ether; polyoxyethylene alkyl esters such as polyoxyethylene monolaurate, polyoxyethylene monostearate, and polyoxyethylene monooleate; and polyoxyalkylene derivatives such as polyoxyethylene alkylene alkylether, polyoxyethylene distyryl phenyl ether, polyoxyethylene tribenzylphenylether, and polyoxyethylene polyoxypropylene glycol.

Examples of betaine type emulsifier include alkyl betaines such as lauryl betaine and stearyl betaine; and alkylamine oxides such as lauryl dimethylamine oxide.

Examples of the polymer emulsifier include high molecular polycarboxylic acid sodium salt, high molecular polycarboxylic acid ammonium salt, and high molecular polycarboxylic acid.

Examples of the reactive emulsifier include polyoxyalkylene alkenyl ethers such as polyoxyalkylene alkenyl ether ammonium sulfate.

The emulsifier can be used alone or in combination.

In these emulsifiers, emulsifiers which do not contain alkali metal ions is preferable, and dialkyl sulfosuccinate and polyoxyalkylene derivatives are more preferable.

In addition, it is more preferable to combine the dialkyl sulfosuccinate and the polyoxyalkylene derivative from the viewpoint that amounts of sulfonic acid type compounds can be reduced.

Examples of the dispersion stabilizer include low water-soluble inorganic salts such as calcium phosphate, calcium carbonate, aluminum hydroxide, and starch silica; nonionic polymers such as polyvinyl alcohol, polyethylene oxide, and cellulose derivatives; and anionic polymers such as polyacrylic acid or the salts, polymethacrylic acid or the salts, and copolymers of methacrylates and methacrylic acid or the salts.

In these dispersion stabilizers, nonionic polymers are preferable from the viewpoint of excellent electrical characteristics.

In addition, at least two dispersion stabilizers can be combined depending on an object from the viewpoint of coexistence with the polymerization stability.

Examples of the chain transfer agent include mercaptans such as n-dodecyl mercaptan, t-dodecyl mercaptan, n-octyl mercaptan, t-octyl mercaptan, n-tetradecyl mercaptan, n-hexyl mercaptan, and n-butyl mercaptan; halogen compounds such as carbon tetrachloride and ethylene bromide; and α-methyl styrene dimer.

The chain transfer agent can be used alone or in combination.

The present powder is obtained by recovering with a method of spray-drying (a spray dry method) of an emulsion of the present polymer.

The method of spray-drying is a method that an emulsion of polymer is sprayed as micro droplets and the micro droplets are dried by exposing of hot wind.

In the method of spray-drying, examples of the method to generate droplets include a rotary disk method, pressure nozzle method, two-fluid nozzle method, and pressurized two-fluid nozzle method.

For a capacity of a dryer, there can be used any scale from a small scale used in a laboratory to an extensive scale used industrially.

A location of an inlet-portion which is a feeding section of heated gas for drying, and a location of an outlet portion which is an exhaust port of heated gas for drying and the powder may be the same as portions of spray dryers which are usually used.

In the case of spray-drying, the emulsion of the present polymer can be used alone or in combination with a mixed state.

In addition, inorganic fillers such as silica, talc and calcium carbonate, polyacrylate, polyvinyl alcohol, and polyacrylamide may be added for improving of powder properties such as blocking in spray-drying and bulk specific gravity.

Also, spray-drying may be applied after addition of compounds such as antioxidants and additives if necessary.

In the present invention, the present powder can be added to a curable resin.

A curable resin includes a thermosetting resin and an active energy-ray curable resin.

Examples of the thermosetting resin include epoxy resins, phenol resins, melamine resins, urea resins, oxetane resins, unsaturated polyester resins, alkyd resins, polyurethane resins, acrylic resins and polyimide resins.

These can be used alone or in combination.

The active energy-ray curable resin includes resins curable with irradiation by lights such as ultraviolet light and an electron beam.

Examples of the active energy-ray curable resin include active energy-ray curable acrylic resins, active energy-ray curable epoxy resins, and active energy-ray curable oxetane resins.

In addition, in the present invention, there can be used resins for hybrid curing (dual curing) of heat curing and active energy-ray curing depending on an object as the curable resin.

In these curable resins, epoxy resins, phenol resins, polyimide resins and oxetane resins are preferable from the viewpoint of suitability for fields of electronic materials because of high insulating properties and excellent electrical characteristics.

Examples of the epoxy resin include bisphenol A type epoxy resins such as JER827, JER828 and KER834 (products made in Japan epoxy resin Co., Ltd.), and RE-310S (a product made in Nippon Kayaku Co., Ltd.); bisphenol F type epoxy resins such as JER806L (a product made in Japan epoxy resin Co., Ltd.) and RE303S-L (a product made in Nippon Kayaku Co., Ltd.); naphthalene type epoxy resins such as HP-4032 and HP-4032D (products made in DIC Corporation); biphenyl type epoxy resins such as NC-3000

(a product made in Nippon Kayaku Co., Ltd.) and YX4000 (a product made in Japan epoxy resin Co., Ltd.); crystalline epoxy resins such as YDC-1312, YSLV-80XY, and YSLV-120TE (products made in Tohto Kasei Co., Ltd.); cycloaliphatic epoxy resins such as YX8000 (a product made in Japan epoxy resin Co., Ltd.) and CEL2021P (a product made in Daicel Chemical Industries, Ltd.); and heat-resistant epoxy resins such as EPPN-501H, EPPN-501HY, and EPPN-502H (products made in Nippon Kayaku Co., Ltd.).

In addition, examples of the epoxy resin include hydrogenated bisphenol A type epoxy resins, bisphenol AD type epoxy resins, bisphenol E type epoxy resins, dicyclopentadiene type epoxy resins, phenolic novolac type epoxy resins, cresol novolac type epoxy resins, brominated epoxy resins, and glycidyl amine type epoxy resins.

Also, examples of the epoxy resin include prepolymers of the above epoxy resins, polyether modified epoxy resins, copolymers with the above epoxy resin units such as silicone modified epoxy resin units, and other polymer units, and resins that a part of epoxy resins are substituted with reactive diluents having epoxy groups.

Examples of the above reactive diluent include monoglycidyl compounds such as resorcin glycidyl ether, t-butyl phenyl glycidyl ether, 2-ethylhexyl glycidyl ether, allyl glycidyl ether, phenyl glycidyl ether, 3-glycidoxy propyl trimethoxysilane, 3-glycidoxy propyl methyl dimethoxysilane, 1-(3-glycidoxy propyl)-1,1,3,3,3-penta methylsiloxane, and N-glycidyl-N,N-bis[3-(trimethoxysilyl)propyl] amine; diglycidyl compounds such as neopentylglycol diglycidyl ether, 1,6-hexanediol diglycidyl ether, and propylene glycol diglycidyl ether; and monocycloaliphatic epoxy resins such as 2-(3,4)-epoxy cyclohexyl ethyl trimethoxysilane.

These epoxy resins can be used alone or in combination.

In the present invention, the epoxy resin is preferably a liquid epoxy resin at room temperature or a resin or resins mainly comprising an epoxy resin which is a solid at room temperature but liquifies before enough curing when being heated, from the viewpoint of giving gelation characteristics to the present resin composition.

In addition, when the present resin composition is used as a fluidal sealant, examples of the epoxy resin include bisphenol A type epoxy resins, hydrogenated bisphenol A type epoxy resins, bisphenol F type epoxy resins, bisphenol S type epoxy resins, 3,3',5,5'-tetramethyl-4,4'-dihydroxy diphenylmethane diglycidyl ether type epoxy resins, 3,3',5, 5'-tetramethyl-4,4'-dihydroxybiphenyl diglycidyl ether type epoxy resins, 4,4'-dihydroxybiphenyl diglycidyl ether type epoxy resins, 1,6-dihydroxynaphthalenee type epoxy resins, phenol novolac type epoxy resins, cresol novolac type epoxy resins, brominated bisphenol A type epoxy resins, brominated cresol novolac epoxy resins, and bisphenol D type epoxy resins.

In the present invention, the present resin composition comprises the present powder and the curable resin.

The content of the present powder in the present resin composition is preferably 1% by mass or more, and more preferably 3% by mass or more.

When the content of the present powder is 1% by mass or more, a sufficient gel state can be achieved, and bleeding out in applications or processing methods, or possible pattern confusion can be restrained.

In addition, content of the present powder is preferably 50% by mass or less, and more preferably 30% by mass or less.

When the content of the present powder is 50% by mass or less, increase of paste viscosity of the present resin composition, and possible decrease of processing properties or working properties, according to applications can be restrained.

In addition, there may be combined a plurality of the present powder that gelation temperatures are different, for production of desired gelation characteristics.

The present resin composition can be used for various applications such as coatings by a dispenser method, screen-printing method, dipping method, casting method, knife coater method, doctor coater method and the like.

In the present resin composition, various fillers or additives can be blended if necessary.

Examples of the filler include conductive fillers such as silver powder, gold powder, nickel powder, and copper powder; and insulation fillers such as aluminum nitride, calcium carbonate, silica, and alumina.

The filler can be blended with an appropriate amount depending on an addition object.

An example of the silica includes crystalline or amorphous silica that a form is sheet type, needle type, spherical, or indeterminate.

For the spherical silica, various types of well-known silica can be used as far as gelation characteristics and viscosity characteristics of the present resin composition are not lost.

There can be specifically used silica obtained by cutting of a coarse particle, and silica particles which are obtained by blending of plural of silica with various particle sizes in accordance with the packing model of Hose Fields from the viewpoint of dispersibility, high fluidity and high charging efficiency.

Examples of the additive include thixotropic-imparting agents, flow improvers, flame retardants, heat resistant stabilizers, antioxidants, ultraviolet absorbers, ionic adsorbents, coupling agents, surface lubricants and stress relaxation agents.

For the flame retardant, there can be used well-known flame retardants such as phosphorus type ones, halogen type ones, and inorganic retardants without departing from the object of the invention.

Examples of the heat resistant stabilizer include phenolic antioxidants, sulfur antioxidants, and phosphorus antioxidants.

Examples of the phenolic antioxidant include monophenols such as 2,6-di-tert-butyl-p-cresol, butylated hydroxyanisole, 2,6-di-t-butyl-p-ethylphenol, and stearyl-β-(3,5-di-t-butyl-4-hydroxyphenyl)propionate; bisphenols such as 2,2'-methylenebis(4-methyl-6-t-butyl phenol), 2,2'-methylenebis (4-ethyl-6-t-butyl phenol), 4,4'-thiobis(3-methyl-6-t-butyl phenol), 4,4'-butylidene bis(3-methyl-6-t-butyl phenol), and 3,9-bis[1,1-dimethyl-2-{β-(3-t-butyl-4-hydroxy-5-methylphenyl)propionyloxy}ethyl]2,4,8,10-tetraoxaspiro[5, 5]undecane; and high molecular type phenols such as 1,1, 3-tris(2-methyl-4-hydroxy-5-t-butyl phenyl)butane, 1,3,5-trimethyl-2,4,6-tris(3,5-di-t-butyl-4-hydroxybenzyl) benzene, tetrakis-[methylene-3-(3',5'-di-t-butyl-4'-hydroxyphenyl)propionate]methane, bis[3,3'-bis-(4'-hydroxy-3'-t-butyl phenyl)butylic acid]glycol ester, 1,3,5-tris (3',5'-di-t-butyl-4'-hydroxybenzyl)-S-triazine-2,4,6-(1H, 3H,5H) trione, and tocophenol.

Examples of the sulfur antioxidant include dilauryl-3,3'-thiodipropionate, dimyristyl-3,3'-thiodipropionate, and distearyl-3,3'-thiodipropionate.

Examples of the phosphorus type antioxidant include phosphites such as the triphenyl phosphite, diphenylisodecyl phosphite, phenyldiisodecyl phosphite, tris(nonylphenyl) phosphite, diisodecyl pentaerythritol phosphite, tris(2,4-di-t-butylphenyl)phosphite, cyclic neopentanetetraylbis(octadecyl)phosphite, cyclic neopentanetetraylbis(2,4-di-t-butylphenyl)phosphite, cyclic neopentanetetraylbis (2,4-di-t-butyl-4-methylphenyl)phosphite, and bis[2-t-butyl-6-methyl-4-{2-(octadecyloxy carbonyl)ethyl}phenyl] hydrogene phosphite; and oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-decyloxy-9, 10-dihydro-9-oxa-10-phosphaphenanthrene-10-oxide.

These antioxidants can be used alone, respectively.

However, there is preferable a combination use of at least two like combination of phenolic type and sulfur type, or phenolic type and phosphorus type.

In the present invention, when the epoxy resin is used as the curable resin in the present resin composition, there can be used curing agents such as acid anhydrides, amine compounds, and phenolic compounds for curing of the curable resin.

Curing ability and cured substance properties of the epoxy resin can be adjusted with the use of the curing agent, and particularly, when an acid anhydride is used as the curing agent, it is preferable because heat resistance and chemical resistance of the present cured substance can be improved.

Examples of the above acid anhydride include phthalic anhydride, methyl tetrahydrophthalic anhydride, methyl hexahydrophthalic anhydride, hexahydrophthalic anhydride, tetrahydrophthalic anhydride, trialkyl tetrahydrophthalic anhydride, methyl himic acid anhydride, methylcyclohexene tetracarboxylic acid anhydride, trimellitic acid anhydride, pyromellitic acid anhydride, benzophenone tetracarboxylic acid anhydride, ethyleneglycol bistrimellitate, glycerol tristrimellitate, dodecenyl succinic anhydride, polyazelaic acid anhydride, and poly(ethyl octadecanedioic acid) anhydride.

In these compounds, in applications that characteristics such as weather resistance, light resistance, or heat resistance are required, methylhexahydrophthalic anhydride and hexahydrophthalic anhydride are preferable.

Examples of the amine compound include aliphatic polyamines such as ethylenediamine, diethylenetriamine, triethylenetetramine, tetraethylenepentamine, hexamethylene diamine, trimethyl hexamethylene diamine, m-xylenediamine, 2-methyl pentamethylenediamine, and diethylaminopropyl amine; alicyclic polyamines such as isophorone diamine, 1,3-bisamino methylcyclohexane, methylene bis-cyclohexanamine, norbornene diamine, 1,2-diaminocyclohexane, bis(4-amino-3-methyl dicyclohexyl)methane, diamino dicyclohexylmethane, and 2,5(2,6)-bis (aminomethyl) bicycle[2,2,1]heptane; and aromatic poly amines such as diamino diethyl diphenylmethane, diaminophenylmethane, diaminodiphenylsulphone, diaminodiphenyl methane, m-phenylenediamine, and diamino diethyl toluene.

In a application that weather resistance, light resistance, or heat resistance is required, 2,5(2,6)-bis(aminomethyl) bicycle[2,2,1]heptane and isophorone diamine are preferable.

These can be used alone or in combination.

Examples of the phenolic compound include phenolic novolac resins, creosol novolac resins, bisphenol A, bisphenol F, bisphenol AD, and diallyl derivatives of the bisphenols.

In these compounds, bisphenol A is preferable because the present cured substance is excellent in machine strength and curing ability.

These can be used alone or in combination.

The amount of the curing agent is preferably 20 to 120 parts by mass, and more preferably 60 to 110 parts by mass, to 100 parts by mass of the epoxy resin, from the viewpoint that the present cured substance is excellent in heat resistance and curing ability.

For the amount of the curing agent to 1 equivalent amount of epoxy group, acid anhydride group is preferably 0.7 to 1.3 equivalent amount and more preferably 0.8 to 1.1 equivalent amount when acid anhydride is used, active hydrogen is preferably 0.3 to 1.4 equivalent amount and more preferably 0.4 to 1.2 equivalent amount when an amine type compound is used, and active hydrogen is preferably 0.3 to 0.7 equivalent amount and more preferably 0.4 to 0.6 equivalent amount when a phenolic compound is used.

In the present invention, when the epoxy resin is cured, an accelerator or a latent curing agent can be used if necessary.

For the accelerator, well-known compounds used as heat-curing catalysts of the epoxy resin can be used.

Examples of the accelerator include imidazole compounds such as 2-methyl imidazole and 2-ethyl-4-methyl imidazole; adducts of imidazole compounds and the epoxy resin; organophosphorous compounds such as triphenylphosphine; borates such as tetraphenylphosphine tetraphenylborate; and diazabicyclo undecene (DBU).

These can be used alone or in combination.

When the accelerator is used, the usual amount of the accelerator is preferably 0.1 to 8 parts by mass and more preferably 0.5 to 6 parts by mass to 100 parts by mass of the epoxy resin.

The latent curing agent is a solid at room temperature, and it liquefies in heat curing of the epoxy resin to act as the curing agent.

Examples of the latent curing agent include dicyandiamide, carbohydrazide, oxalic dihydrazide, malonic acid dihydrazide, succinic acid dihydrazide, imino diacetic acid dihydrazide, adipic acid dihydrazide, pimelic acid dihydrazide, suberic acid dihydrazide, azelaic acid dihydrazide, sebacic acid dihydrazide, dodecane dihydrazide, hexadecane dihydrazide, maleic acid dihydrazide, fumaric acid dihydrazide, diglycolic acid dihydrazide, tartaric acid dihydrazide, malic acid dihydrazide, isophthalic acid dihydrazide, terephthalic acid dihydrazide, 2,6-naphthoic acid dihydrazide, 4,4'-bis benzene dihydrazide, 1,4-naphthoic acid dihydrazide, AJICURE VDH and AJICURE UDH (both trade names, made in Ajinomoto Co., Inc.), organic acid hydrazides such as citric acid trihydrazide, and various amine adduct type compounds.

These can be used alone or in combination.

In the present invention, when the oxetane resin is used as the curable resin in the present resin composition, for example, the oxetane resin can be cured by blending of curing agents such as acid anhydrides, or by blending of curing catalysts which are possible for ring-opening of the oxetane ring and polymerization, by heating.

Examples of the oxetane resin include EHO, OXBP, OXMA, and OXTP (products made in Ube Industries, Ltd.).

The amount of the curing agent or the curing catalyst in the case of the oxetane resin is the same as in the case of the epoxy resin.

In addition, the epoxy resin may be combined in the oxetane resin.

When the present resin composition is prepared, well-known kneading devices can be used.

Examples of the kneading device to obtain the present resin composition include milling machines, attritors, planetary mixers, disolvers, three roll mills, ball mills, and bead mills.

In addition, these can be used in combination.

When the additive is blended with the present resin composition, an order for blending is not necessary.

However, it is preferable as much final kneading of the present powder as possible for sufficient showing of advantage offered by the invention.

In addition, when a temperature in the system rises with shear heat releasing by kneading, it is preferable to contrive not to raise the temperature in kneading.

The heat stabilizer and the like can be blended as an aqueous solution with an emulsion of the present polymer, and then the emulsion can be spray dried with the aforementioned condition.

The present resin composition can be used for various applications such as fluidal sealants like primary-mounting under-filling materials, secondary-mounting under-filling materials and glob-top materials in wire bonding; sealing sheets to seal various tips on boards in the lump; pre-dispensing type under-filling materials; sealing sheets to collectively seal on a wafer level; adhesion layers for three layer-copper-clad laminates; adhesion layers for die bond films, diagram touch films, layer-insulation films, cover-lay film, and the like; adherent pastes such as die bond pastes, layer-insulation pastes, conductive pastes and anisotropic conductive pastes; sealants of light emitting diodes; optical adhesives; and sealing materials of various flat panel displays like a crystalline liquid and an organic electroluminescence.

For example, after metallic jointing (primary mounting) of a semiconductor IC electrode and a package substrate electrode was carried out, or after placing (secondary mounting) of a semiconductor IC package on a mother board was carried out, the present resin composition can be used with a dispenser coating being generally applied as later-supplying under-filling materials which are filled in each of jointing spaces for example.

In addition, for former-supplying under-filling materials, which are coated on a package substrate before a semiconductor IC electrode and a package substrate electrode are connected by metallic bonding or pressure welding, there are generally liquid type ones and film type ones, and they can be used for both of a dispenser coating and screen-printing depending on each form.

In addition, the present resin composition can be used for a sealing sheet which can seal a semiconductor or an electronic device using a press device or a roll laminator, and which is used for sealing by flowing of a resin with heating and pressing after placing of the sealing sheet on a device.

The sealing sheet being used for such purposes includes sheets which can be used for sealing in systems such as wire bonding, flip chip, wafer level CSP and module, which are covered with a release film, and which have shapes such as a roll-shape, strip-shape and label-shape.

In addition, for example, thickness of the sealing sheet includes 30 to 500 μm.

Examples of coating methods of a die attach paste which is used for placing of a semiconductor silicon chip to a lead frame include a syringe dispensing method, a line drawing method, a stamping method, and a screen printing method.

In the above case, examples of a base polymer blended in the present resin composition include an epoxy resin, a polyimide resin, a cyanate ester resin, and a maleimide resin.

Examples of the filler include conductive type ones such as Ag, Au, Cu, and Ni; and insulating type ones such as $SiO_2$, $Al_2O_3$, and BN.

Examples of the diluent include solvent type ones such as butyl cellosolve, and butyl cellosolve acetate; and solventless type ones such as reactive diluents (low viscous epoxy resins).

When a varnish is prepared with the use of the present resin composition, the varnish can be used as a prepreg which is half cured after impregnation of the varnish into a base material such as glass fabrics.

Thickness of the prepreg varies according to applications and is 40 to 200 μm.

The present cured substance is obtained by curing of the present resin composition.

When a thermosetting resin is used for the curable resin, curing condition may has 10 minutes to 5 hours at 80 to 180° C. for example.

In addition, when the active energy-ray curable resin is used for the curable resin, examples of an active energy-ray to be used include an electron beam, an ultraviolet ray, a gamma ray and an infrared ray.

Also, with curing by the active energy-ray, there can be used a well-known ultraviolet irradiation device having a lamp such as a high-pressure mercury-vapor lamp, an excimer lamp, and a metal halide lamp in the case of ultraviolet ray curing.

Irradiance of the ultraviolet ray is usually 50 to 1,000 $mJ/cm^2$.

A well-known electron beam irradiation device can be used in the case of electron beam curing, and irradiance of the electron beam is usually 10 to 100 kGy.

EXAMPLE

The present invention is described by embodiments specifically as follows. However, the present invention is not limited to these embodiments.

Hereinafter, "part" and "%" show "part by mass" and "% by mass", respectively. However, thickening ratio "%" in storage stability and increasing rate "%" in dielectric constant are out of the limit.

Evaluation in the present embodiments was carried out with the use of the following methods.

(1) Emulsion Particle Size and Mono-Dispersibility

The volume average primary particle size (Dv) and the number average primary particle size (Dn) were measured as the emulsion particle size with the use of a sample that a vinyl polymer emulsion was diluted in deionized water and with the use of a laser diffraction scattering type particle size distribution measuring apparatus (LA-910W made in Horiba, Ltd.).

As an refractive index, there was used a refractive index calculated by a monomer composition for loading.

When a particle has a multilayer-structure such as a core-shell structure, refractive index of each layer was calculated, and an entire average value by calculation of use of a mass ratio of each layer was used.

Median sizes were used for all average sizes.

In addition, Mono-dispersibility (Dv/Dn) was obtained with the use of Dv and Dn.

Mono-dispersibility was evaluated using the following standard.

A: 1.5 or less
B: more than 1.5, and 2.0 or less
C: more than 2.0, and 3.0 or less
D: more than 3.0

Concentration of a vinyl polymer emulsion sample was adjusted appropriately so that it was set in the suitable range with the use of a scattering light strength monitor attached with a device.

(2) Acetone Soluble Component

In 50 g of acetone, 1 g of a vinyl polymer powder is dissolved to make a solution, and then the solution was refluxed and extracted for 6 hours at 70° C.

The extracting liquid was centrifuged with 14,000 rpm for 30 minutes at 4° C. with the use of a centrifugal separator (CRG SERIES made in Hitachi, Ltd.).

A segregated acetone-soluble component was removed by decantation, and an acetone insoluble component was dried for 24 hours at 50° C. in a vacuum dryer, then the mass was measured.

The acetone-soluble component (%) was calculated using the following formula.

(The acetone-soluble component)=(1−mass of the acetone insoluble component)×100

(3) Molecular Weight of the Acetone-Soluble Component

A solid of the acetone-soluble component was obtained by extraction of acetone from the acetone-soluble component which has been obtained by the measurement of the above acetone-soluble component.

Mass average molecular weight (Mw) of the above solid was measured with the use of gel permeation chromatography under the following conditions.

In addition, number average molecular mass (Mn) was measured.

Device: HLC8220 made in Tosoh Corp.
Column: TSK gel Super HZM-M (4.6 mm of inside size×15 cm in length) made in Tosoh Corp., numbers; 4, Exclusion limit; 4×10$^6$
Temperature: 40° C.
Carrier liquid: tetrahydrofuran
Flow rate: 0.35 mL/min
Concentration of a sample: 0.1%
Injection rate of a sample: 10 µl
Standard: polystyrene (4) Ionic Impurity To a glass pressure vessel, 20 g of a vinyl polymer powder was added, and 200 mL of deionized water was added with the use of a measuring cylinder.

After closing of a cap of vessel, the vessel was strongly shaken and the vinyl polymer powder was dispersed uniformly in water, then, the vinyl polymer powder dispersion was obtained.

After this, extraction of ionic components in the vinyl polymer powder was carried out by setting of the dispersion in a gear oven for 20 hours at 95° C.

After the glass vessel was taken out from the oven and was cooled, the dispersion liquid after heating in the gear oven was filtered with a membrane filter with 0.2 µm (Mixes Cellulose Ester Membranes made in Advantec MFS, Inc., a model number: A020A025A), and a filtrate was divided into 2 sampling bottles with 100 mL by 100 mL.

The content of alkali metal ions and sulfate ion in the vinyl polymer powder was measured under the following conditions with the use of each sampling bottle, respectively.

It is noted that the content of the alkali metal ion was total amounts of Na ion and K ion.

(a) Measurement Condition of the Content of Alkali Metal Ions
ICP emission analysis device: IRIS "Intrepid II XSP" made in Thermo Corporation
Quantitative method: an absolute calibration method with the use of concentration-known samples (4 points of 0 ppm, 0.1 ppm, 1 ppm and 10 µm)
Measurement wavelength: Na; 589.5 nm and K; 766.4 nm (b) Measurement Condition of the Content of Sulfate Ion
Ion chromatograph: "IC-20 model" made in Dionex Corporation
Isolation column: IonPac AS12A
Quantitative method: an absolute calibration method with the use of a concentration-known sample with 4 ppm of sulfate ion (5) Initial Viscosity An epoxy resin composition was prepared and was immediately adjusted to 25° C., then initial viscosity of the epoxy resin composition was obtained with the use of a BM type viscometer (a Brookfield viscometer made in Tokyo Keiki Co., Ltd., rotor No.; 4, RPM; 6 rpm)

(6) Dispersibility

Dispersion level of the vinyl polymer powder in the epoxy resin composition was measured with the use of fineness gages according to JIS K-5600, and dispersibility was evaluated using the following standard.
A: 1 µm or less
B: more than 1 µm, and 10 µm or less
C: more than 10 µm, and 20 µm or less
D: more than 20 µm (7) Gelation Temperature and Curing Temperature Temperature dependency of viscoelasticity of an epoxy resin composition was measured under conditions of starting temperature of 40° C., final temperature of 200° C., and increasing rate of temperature of 4° C./min with the use of a dynamic viscoelasticity-measuring apparatus ("Rheosol G-3000" made in UBM Corporation, parallel plate dimeter; 40 mm, gap; 0.4 mm, frequency; 1 Hz, twist angle; 1 degree)

In addition, there was determined a temperature when a ratio (G"/G'=tan δ) of storage elastic modulus G' to loss elastic modulus G", which is 10 or more at the starting point of measurement, became 10 during increasing of temperature.

There was defined as the curing temperature ($T_A$) the above temperature when an epoxy resin composition without the vinyl polymer powder was used for a sample.

Also, there was defined as the gelation temperature ($T_B$) the above temperature when an epoxy resin composition comprising the vinyl polymer powder was used for a sample.

The gelation temperature was evaluated using the following standard.
A: Gelation is acknowledged at a temperature lower than the curing temperature. ($T_A > T_B$)
D: Gelation is acknowledged until a temperature reaches the curing temperature. ($T_A \geq T_B$)

(8) Gelation Performance

In the measurement of the gelation temperature of the epoxy resin composition comprising the above vinyl polymer powder, there was defined as $G_A$ storage elastic modulus G' at the temperature of gelation temperature minus 20° C., and there was defined as $G_B$ (arrival elastic modulus) storage elastic modulus G' at the temperature of gelation temperature plus 20° C. Then, the ratio ($G'_B/G'_A$) was obtained.

It is noted that "7.07E-03" means "7.07×10$^{-3}$" in the numerical value of G'.

Gelation performance was evaluated using the following standard.

A: 1,000 or more
B: 100 or more, less than 1,000
C: 10 or more, less than 100
D: less than 10

(9) Storage Stability

Storage stability in −10° C. of an epoxy resin composition was evaluated by thickening ratio calculated by the following formula with the initial viscosity and viscosity after storage for 24 hours measured with the use of a BM type viscometer like the measurement of the initial viscosity.

[Thickening ratio]=(([Viscosity after storage for 24 hours]/[Initial viscosity])−1)×100(%)

In addition, there was defined as $R_B$ the thickening ratio of the epoxy resin composition without containing of the vinyl polymer powder, and there was defined as $R_A$ the thickening ratio of the epoxy resin composition containing the vinyl polymer powder. Then, the ratio ($R_A/R_B$) was obtained.

Storage stability was evaluated using the following standard.

Here, when $R_B$ became less than 1%, the ratio ($R_A/R_B$) was obtained by defining of $R_B$ as 1%.

A: 10 or less
B: more than 10, 100 or less
C: more than 100
E: Measurement cannot be applied.

It is noted that viscosity was measured about a sample, which was immediately adjusted to 25° C. after keeping of the epoxy resin composition in a refrigerator at −10° C. for 24 hours, in the case of evaluation of storage stability at −10° C.

(10) Dieletcric Constant

A test piece (30 mm in length, 30 mm in width and 3 mm in thickness) of a cured substance of an epoxy resin composition was annealed for 6 hours at 190° C. and moisture conditioning of a test piece was carried out for more than 24 hours at 23° C. and 50% of humidity.

Then, dielectric constant in frequency 1 GHz was measured for the above test piece with the use of a measuring apparatus of dielectric constant (RF impedance/material analyzer HP4291B (Trade name) and an electrode for measurement of dielectric constant; HP16453A, made in Agilent Technologies Inc., and a micrometer made in Mitutoyo Corporation).

There was defined as $\in_{rB}$ dielectric constant of the epoxy resin composition without containing of the vinyl polymer powder, and there was defined as $\in_{rA}$ dielectric constant of the epoxy resin composition containing of the vinyl polymer powder.

An increasing rate was obtained by the following equation and evaluated using the following standard.

[Increasing rate]=(($\in_{rA}/\in_{rB}$)−1)×100(%)

A: 1.0 or less
B: more than 1.0, 2.5 or less
C: more than 2.5, 3.0 or less
D: more than 3.0

[Preparation of Vinyl Polymer Powders]

According to the following Example 1 to 11 and Comparative example 1 to 4, there were produced vinyl polymer emulsions (L1) to (L14) and vinyl polymer powders (P1) to (P15).

Following raw materials were used in Examples 1 to 11 and Comparative examples 1 to 4.

Di-2-ethylhexyl sulfosuccinic acid ammonium: Trade name "RIKACOL M-300", made in Toho Chemical Industry Co., Ltd.

Polyoxyethylene distyryl phenyl ether: Trade name "Emulgen A-90", made in Kao Corporation Methyl methacrylate: Trade name "Acryester M", made in Mitsubishi Rayon Co., Ltd.

n-Butyl methacrylate: Trade name "Acryester B", made in Mitsubishi Rayon Co., Ltd.

n-Butyl acrylate: made in Mitsubishi Chemical Corp. Co., Ltd.

Allyl methacrylate: Trade name "Acryester A", made in Mitsubishi Rayon Co., Ltd.

i-Butyl methacrylate: Trade name "Acryester IB", made in Mitsubishi Rayon Co., Ltd.

Methacrylic acid: Trade name "Acryester MAA", made in Mitsubishi Rayon Co., Ltd.

2-Hydroxy ethyl methacrylate: Trade name "Acryester HO", made in Mitsubishi Rayon Co., Ltd.

Alkyl methacrylate: Trade name "Acryester SL", made in Mitsubishi Rayon Co., Ltd.

n-Octyl mercaptan: made in Katayama chemistry Co., Ltd. (a special grade agent)

2,2'-Azobis[N-(2-carboxyethyl)-2-methyl propione amidine]hydrate: Trade name "VA-057" (57° C. of 10 hour-half value period temperature), made in Wako Junyaku Inc.

2,2'-Azobis(2,4-dimethyl valerontrile): Trade name "V-65" (51° C. of 10 hour-half value period temperature), made in Wako Junyaku Inc.

1,1,3,3-Tetramethylbutyl peroxy-2-ethyl hexanoate: Trade name "PEROCTA 0", made in NOF Corp.

Example 1

Production of Vinyl Polymer Emulsion (L1) and Vinyl Polymer Powder (P1)

To a 2-liter, separable flask equipped with a Maxblend agitator, reflux condenser, thermal control unit, titration pump and nitrogen introduction pipe, 624.0 g of deionized water was added, and bubbling of nitrogen gas was carried out under agitation with 120 rpm for 30 minutes.

There was prepared monomer mixture (M1), which was a mixture of 226.7 g of methyl methacrylate and 173.3 g of n-butyl methacrylate, for the first step polymerization.

After addition of 40.0 g of monomer mixture (M1) into the above flask, the mixture in the flask was raised to 80° C. under nitrogen atmosphere.

Then, a previously prepared water solution with 0.32 g of ammonium persulfate and 16.0 g of deionized water was added in a lump to the flask, and the flask was maintained for 60 minutes, so that seed particles were prepared.

In the flask in which the above seed particles were prepared, the mixture, obtained by emulsification treatment of 360.0 g of remaining monomer mixture (M1), 4.0 g of di-2-ethylhexyl sulfosuccinic acid ammonium and 200.0 g of deionized water with use of a homogenizer ("ULTRA-TURRAX T-25", made in IKA Japan K. K.) by 25,000 rpm, was titlated with 150 minutes.

Then, the flask was maintained for 1 hour and the first step polymerization was finished.

After that, a monomer mixture for use of the second step polymerization, obtained by emulsification treatment of 253.0 g of methyl methacrylate, 128.3 g of i-butyl methacrylate, 9.3 g of methacrylic acid, 9.4 g of 2-hydroxy ethyl methacrylate, 4.0 g of di-2-ethylhexyl sulfo succinic acid ammonium and 200.0 g of deionized water with use of a homogenizer ("ULTRA-TURRAX T-25", made in IKA Japan K.K.) by 25,000 rpm, was titlated with 150 minutes.

Then, the flask was maintained for 1 hour and vinyl polymer emulsion (L1) was obtained.

An evaluation result of the emulsion particle size of vinyl polymer emulsion (L1) obtained is shown in Table 1.

Vinyl polymer powder (P1) was obtained by spray-drying of vinyl polymer emulsion (L1) under the following condition with the use of L-8 type spray dryer made in Ohkawara Kakohki Co., Ltd.

There are shown in Table 2 evaluation results of a content of an acetone-soluble component, Mw and Mn of the acetone-soluble component, and a content of ionic impurities of vinyl polymer powder (P1) obtained.

[Spray Drying Condition]

Atomizing method: a rotation disk type

Rotation number of the disk: 25,000 rpm

Hot wind temperature
  inlet temperature: 145° C.
  outlet temperature: 65° C.

TABLE 1

| | Vinyl polymer emulsion | | | L1 | L2 | L3 | L4 | L5 | L6 | L7 |
|---|---|---|---|---|---|---|---|---|---|---|
| The first step polymerization | Seed particle (g) | Initial addition | Deionized water | 624.0 | 624.0 | 624.0 | 624.0 | 624.0 | 624.0 | 624.0 |
| | | | Emulsifier 1 | — | — | — | — | — | — | — |
| | | Monomer mixture (M1) | | 40.0 | 40.0 | 40.0 | 40.0 | 40.0 | 40.0 | 40.0 |
| | | | MMA | 22.67 | 34.55 | 34.55 | 34.55 | — | 40.0 | 22.67 |
| | | | n-BMA | 17.33 | 5.45 | 5.45 | 5.45 | — | — | 17.33 |
| | | | n-BA | — | — | — | — | 39.02 | — | — |
| | | | SLMA | — | — | — | — | — | — | — |
| | | | AMA | — | — | — | — | 0.98 | — | — |
| | | Ammonium persulfate | | 0.32 | 0.32 | 0.32 | 0.16 | 0.32 | 0.08 | 0.08 |
| | | Potassium persulfate | | — | — | — | — | — | — | — |
| | | PEROCTA O | | — | — | — | — | — | — | — |
| | | Deionized water | | 16.0 | 16.0 | 16.0 | 16.0 | 16.0 | 16.0 | 16.0 |
| | Titration polymerization (g) | Monomer mixture (M1) | | 360.0 | 520.0 | 520.0 | 520.0 | 520.0 | — | — |
| | | | MMA | 204.03 | 449.15 | 449.15 | 449.15 | — | — | — |
| | | | n-BMA | 155.97 | 70.85 | 70.85 | 70.85 | — | — | — |
| | | | n-BA | — | — | — | — | 507.28 | — | — |
| | | | AMA | — | — | — | — | 12.72 | — | — |
| | | Emulsifier 1 | | 4.0 | 5.6 | 5.6 | 2.8 | 5.6 | — | — |
| | | Emulsifier 2 | | — | — | — | 2.8 | — | — | — |
| | | n-OM | | — | — | — | — | — | — | — |
| | | VA-057 | | — | — | — | 0.1 | — | — | — |
| | | Deionized water | | 200.0 | 280.0 | 280.0 | 280.0 | 280.0 | — | — |
| | | Titration time (minute) | | 150 | 210 | 210 | 210 | 210 | — | — |
| The second step polymerization | Titration polymerization (g) | MMA | | 253.0 | 233.9 | 240.0 | 233.9 | 235.2 | 760.0 | 720.0 |
| | | IBMA | | 128.3 | — | — | — | — | — | — |
| | | MAA | | 9.3 | 6.1 | — | 6.1 | — | — | 40 |
| | | HEMA | | 9.4 | — | — | — | — | — | — |
| | | n-BA | | — | — | — | — | 4.8 | — | — |
| | | n-OM | | — | — | — | — | — | — | — |
| | | Emulsifier 1 | | 4.0 | 2.4 | 2.4 | 0.6 | 2.4 | 8.0 | 8.0 |
| | | Emulsifier 2 | | — | — | — | 1.2 | — | — | — |
| | | VA-057 | | — | — | — | 0.04 | — | — | — |
| | | V-65 | | — | — | — | — | — | 0.16 | 0.16 |
| | | Deionized water | | 200.0 | 120.0 | 120.0 | 120.0 | 120.0 | 400.0 | 400.0 |
| | | Titration time (minute) | | 150 | 90 | 90 | 90 | 90 | 300.0 | 300.0 |
| Emulsion particle size (nm) | Volume average (Dv) | | | 830 | 764 | 606 | 642 | 750 | 596 | 676 |
| | Number average (Dn) | | | 727 | 649 | 575 | 574 | 639 | 576 | 660 |
| | Mono-dispersibility (Dv/Dn) | | | 1.14 | 1.18 | 1.05 | 1.12 | 1.17 | 1.03 | 1.02 |
| | Vinyl polymer emulsion | | | L8 | L9 | L10 | L11 | L12 | L13 | L14 |
| The first step polymerization | Seed particle (g) | Initial addition | Deionized water | 624.0 | 624.0 | 980.0 | 624.0 | 624.0 | 624.0 | 624.0 |
| | | | Emulsifier 1 | — | 0.4 | 7.0 | — | 1.6 | — | — |
| | | Monomer mixture (M1) | | 40.0 | 40.0 | 700.0 | 40.0 | 40.0 | 40.0 | 40.0 |
| | | | MMA | 22.67 | 34.55 | 682.06 | 34.55 | 34.55 | 34.55 | 27.36 |
| | | | n-BMA | 17.33 | 5.45 | — | 5.45 | 5.45 | 5.45 | 10.35 |
| | | | n-BA | — | — | — | — | — | — | — |
| | | | SLMA | — | — | 17.94 | — | — | — | — |
| | | | AMA | — | — | — | — | — | — | 2.29 |
| | | Ammonium persulfate | | 0.08 | 0.32 | — | — | 0.32 | 0.32 | 0.32 |
| | | Potassium persulfate | | — | — | — | 0.40 | — | — | — |
| | | PEROCTA O | | — | — | 1.40 | — | — | — | — |
| | | Deionized water | | 16.0 | 16.0 | 350.0 | 16.0 | 16.0 | 16.0 | 16.0 |
| | Titration polymerization (g) | Monomer mixture (M1) | | — | 520.0 | — | 520.0 | 520.0 | 520.0 | 680.0 |
| | | | MMA | — | 449.15 | — | 449.15 | 449.15 | 449.15 | 465.04 |
| | | | n-BMA | — | 70.85 | — | 70.85 | 70.85 | 70.85 | 175.95 |
| | | | n-BA | — | — | — | — | — | — | — |
| | | | AMA | — | — | — | — | — | — | 39.01 |
| | | Emulsifier 1 | | — | 5.2 | — | 5.6 | 4.8 | 5.6 | 7.2 |
| | | Emulsifier 2 | | — | — | — | — | — | — | — |
| | | n-OM | | — | — | — | — | — | 1.12 | — |
| | | VA-057 | | — | — | — | — | — | — | — |
| | | Deionized water | | — | 280.0 | — | 280.0 | 280.0 | 280.0 | 360.0 |
| | | Titration time (minute) | | — | 210 | — | 210 | 210 | 210 | 270 |

TABLE 1-continued

| | | | | | | | | | | |
|---|---|---|---|---|---|---|---|---|---|---|
| The second step polymerization | Titration polymerization (g) | MMA | 680.0 | 233.9 | — | 233.9 | 233.9 | 233.9 | 80.0 |
| | | IBMA | — | — | — | — | — | — | — |
| | | MAA | 80 | 6.1 | — | 6.1 | 6.1 | 6.1 | — |
| | | HEMA | — | — | — | — | — | — | — |
| | | n-BA | — | — | — | — | — | — | — |
| | | n-OM | — | — | — | — | — | 0.48 | — |
| | | Emulsifier 1 | 8.0 | 2.4 | — | 2.4 | 1.6 | 2.4 | 0.8 |
| | | Emulsifier 2 | — | — | — | — | — | — | — |
| | | VA-057 | — | — | — | — | — | — | — |
| | | V-65 | 0.16 | — | — | — | — | — | — |
| | | Deionized water | 400.0 | 120.0 | — | 120.0 | 120.0 | 120.0 | 120.0 |
| | | Titration time (minute) | 300.0 | 90 | — | 90 | 90 | 90 | 30 |
| Emulsion particle size (nm) | | Volume average (Dv) | 672 | 335 | 2110 | 649 | 181 | 784 | 741 |
| | | Number average (Dn) | 656 | 302 | 1330 | 544 | 164 | 655 | 631 |
| | | Mono-dispersibility (Dv/Dn) | 1.02 | 1.11 | 1.59 | 1.19 | 1.10 | 1.20 | 1.17 |

The abbreviations in the table show the following compounds.

PEROCTA 0:1,1,3,3-tetramethylbutyl peroxy-2-ethyl hexanoate

TABLE 2

| | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Vinyl polmer powder | P1 | P2 | P3 | P4 | P5 | P6 | P7 | P8 | P9 | P10 | P11 |
| Vinyl polymer emulsion | L1 | L2 | L3 | L4 | L2/L5 (1/1) | L6 | L7 | L8 | L9 | L2/L12 (1/1) | L10 |
| Acetone soluble component (%) | >98 | >98 | >98 | >98 | 48 | >98 | >98 | >98 | >98 | >98 | >98 |
| Molecular weight of acetone soluble component (ten thousand) Mw | 112.1 | 75.7 | 56.3 | 110.7 | 75.3 | 114.5 | 128.1 | 141.6 | 63.1 | 69.6 | 108.8 |
| Mn | 25.9 | 22.8 | 17.0 | 43.3 | 20.2 | 33.1 | 58.1 | 62.4 | 18.9 | 19.1 | 25.6 |
| Ionic impurity content (ppm) Alkali metal ion | <1 | <1 | <1 | <1 | <1 | <1 | <1 | <1 | <1 | <1 | <1 |
| Sulfate ion | 73 | 81 | 70 | 19 | 78 | 53 | 55 | 56 | 74 | 77 | 60 |
| Emulsion particle site (nm) Volume average (Dv) | 830 | 764 | 606 | 642 | 759 | 596 | 676 | 672 | 335 | 385 (multi disperse) | 2110 |
| Number average | 727 | 649 | 575 | 574 | 651 | 576 | 660 | 656 | 302 | 154 | 1330 |
| Mono-dispersibility (Dv/Dn) | 1.14 | 1.18 | 1.05 | 1.12 | 1.17 | 1.03 | 1.02 | 1.02 | 1.11 | 2.50 | 1.59 |
| | A | A | A | A | A | A | A | A | A | C | B |

| | Comparative examples | | | | |
|---|---|---|---|---|---|
| | 1 | 2 | 3 | 4 | 5 |
| Vinyl polmer powder | P12 | P13 | P14 | P15 | P16 |
| Vinyl polymer emulsion | L11 | L12 | L13 | L14 | — |
| Acetone soluble component (%) | >98 | >98 | >98 | <5 | <5 |
| Molecular weight of acetone soluble component (ten thousand) Mw | 55.2 | 63.5 | 8.2 | Cannot be applied | 98.4 |
| Mn | 14.4 | 15.4 | 4.1 | | 8.46 |
| Ionic impurity content (ppm) Alkali metal ion | 83.5 | <1 | <1 | <1 | 341 |
| Sulfate ion | 80 | 73 | 75 | 75 | 18 |
| Emulsion particle site (nm) Volume average (Dv) | 649 | 181 | 784 | 741 | — |
| Number average | 544 | 164 | 655 | 631 | — |
| Mono-dispersibility (Dv/Dn) | 1.19 | 1.10 | 1.20 | 1.17 | — |
| | A | A | A | A | |

Emulsifier 1: di-2-ethylhexyl sulfosuccinic acid ammonium
Emulsifier 2: polyoxyethylene distyrylphenyl ether
MMA: methyl methacrylate
n-BMA: n-butyl methacrylate
n-BA: n-butyl acrylate
AMA: allyl methacrylate
IBMA: i-butyl methacrylate
MAA: methacrylic acid
HEMA: 2-hydroxy ethyl methacrylate
SLMA: alkyl methacrylate
n-OM: n-octyl mercaptan
VA-057: 2,2'-azobis[N-(2-carboxyethyl)-2-methyl propione amidine]hydrate
V-65: 2,2'-azobis(2,4-dimethyl valerontrile)

Example 2 to 10

Comparative Example 1 to 4 Production of Vinyl Polymer Emulsion (L2) to (L9) and (L11) to (L14), and Vinyl Polymer Powder (P2) to (P10) and (P12) to (P15)

For Example 2 to 10 and Comparative example 1 to 4, vinyl polymer emulsion (L2) to (L9) and (L11) to (L14) were obtained in the same manner as in Example 1 except that raw material compositions and polymerization conditions shown in Table 1 were used.

Evaluation results of particle size of polymer emulsions obtained are shown in Table 1.

Example 11

Production of Vinyl Polymer Emulsion (L10) and Vinyl Polymer Powder (P11)

To a 2-liter separable flask equipped with a Maxblend agitator, reflux condenser, thermal control unit, titration pump and nitrogen introduction pipe, 980.0 g of deionized water was added.

After bubbling of nitrogen gas under agitation with 120 rpm for 30 minutes, temperature of deionized water in the flask was raised at 80° C.

Then, a mixture, obtained by emulsification treatment of 682.06 g of methyl methacrylate, 17.94 g of alkyl methacrylate (SLMA), 7.0 g of di-2-ethylhexyl sulfosuccinic acid ammonium, 1.40 g of "PEROCTA 0" and 350.0 g of deionized water with use of a homogenizer ("ULTRA-TURRAX T-25", made in IKA Japan K., K.) by 25,000 rpm, was added in a lump to the flask.

Then, the flask was maintained for 300 minutes and vinyl polymer emulsion (L10) was obtained.

An evaluation result of particle size of vinyl polymer emulsion (L10) obtained is shown in Table 1.

Vinyl polymer powder (P11) was obtained by spray-drying of vinyl polymer emulsion (L10) in the same manner as in Example 1.

In the production of Vinyl polymer powder (P2) to (P4), (P6) to (P9), and (P12) to (P15), vinyl polymer emulsion (L2) to (L4), (L6) to (L9), and (L11) to (L14) were used respectively.

In the production of vinyl polymer powder (P5), there was used a mixed emulsion of 50% of vinyl polymer emulsion (L2) and 50% of vinyl polymer emulsion (L5).

Also, in the production of vinyl polymer powder (P10), there was used a mixed emulsion of 50% of vinyl polymer emulsion (L2) and 50% of vinyl polymer emulsion (L12).

Except use of the above emulsions, vinyl polymer powders were produced in the same manner as in Example 1.

Evaluation results of a content of an acetone-soluble component, Mw and Mn of the acetone-soluble component, and a content of ionic impurities of vinyl polymer powders (P2) to (P15) obtained are shown in Table 2.

Comparative Example 5

Vinyl Polymer Powder (P16)

As vinyl polymer powder (P16), F351 (made in Ganz Chemical Co., Ltd.) was used.

Evaluation results of a content of an acetone-soluble component, Mw and Mn of the acetone-soluble component, and a content of ionic impurities are shown in Table 2.

Example 12

There was obtained a kneading material consisting of 100 parts of a bisphenol A type epoxy resin ("Epicoat 828" (Trade name) made in Japan epoxy resin Co., Ltd.) and 10 parts of vinyl polymer powder (P1) shown in Table 3 with the use of a planetary centrifugal vacuum mixer ("Thinky Mixer ARV-200" (Trade name) made in Thinky Corporation).

The condition of the planetary centrifugal vacuum mixer was kneading and defoaming for 2 minutes with conditions of spin rotation number of 1,000 rpm and revolution rotation number of 2,000 rpm, under reduced pressure of 2,000 Pa.

The kneading material obtained was treated with the use of a three-roll mill ("M-80E" made in EXAKT Technologies, Inc.).

The condition of the three-roll mill was 1 pass treatment with roll interval of 20 μm and 10 μm, 1 pass treatment with roll interval of 10 μm and 5 μm, and 1 pass treatment with roll interval of 5 μm and 5 μm, at roll rotation number of 200 rpm.

Then, to the above kneading material, 85 parts of a curing agent (an acid anhydride-based curing agent "RIKACID MH-700" (Trade name) made in New Japan Chemical Co., Ltd.) and 1 part of an accelerator (2-ethyl-4-methyl imidazole made in Shikoku Chemicals Corporation) shown in Table 3 were added.

Subsequently, there was obtained epoxy resin composition (C1) by re-use of the planetary centrifugal vacuum mixer ("Thinky Mixer ARV-200" (Trade name) made in Thinky Corporation).

The condition of the planetary centrifugal vacuum mixer was kneading and defoaming for 1 minute with conditions of spin rotation number of 1,000 rpm and revolution rotation number of 2,000 rpm, under reduced pressure of 2,000 Pa.

Evaluations of initial viscosity, dispersibility, gelation temperature, elastic modulus, and storage stability were carried out for epoxy resin composition (C1) obtained.

Evaluation results are shown in Table 3.

In the present invention, the following serial operation is defined as "Primary kneading".

The above serial operation is carried out with the use of a planetary centrifugal vacuum mixer ("Thinky Mixer ARV-200" (Trade name) made in Thinky Corporation) and then carried out with the use of a three-roll mill ("M-80E" made in EXAKT Technologies, Inc.).

The condition of the planetary centrifugal vacuum mixer is kneading and defoaming for 2 minutes with conditions of spin rotation number of 1,000 rpm and revolution rotation number of 2,000 rpm, under reduced pressure of 2,000 Pa.

The condition of the three-roll mill is 1 pass treatment with roll interval of 20 μm and 10 μm, 1 pass treatment with roll interval of 10 and 5 and 1 pass treatment with roll interval of 5 μm and 5 μm, at roll rotation number of 200 rpm.

In addition, the following operation is defined as "Secondary kneading".

The above operation is carried out by re-use of the planetary centrifugal vacuum mixer ("Thinky Mixer ARV-200" (Trade name) made in Thinky Corporation).

The condition of the planetary centrifugal vacuum mixer is kneading and defoaming for 1 minute with conditions of spin rotation number of 1,000 rpm and revolution rotation number of 2,000 rpm, under reduced pressure of 2,000 Pa.

[Production of Cured Substance]

There were prepared two pieces of a laminate-reinforcement glass plate that a PET film (made in Toyobo Co., Ltd., Trade name: TN200) was laminated on one side of the reinforcement glass plate of 300 mm in length, 300 mm in width and 5 mm in thickness.

Two pieces of a laminate-reinforcement glass plate were stood in line so that a PET film surface faces each other.

Subsequently, a mold was prepared by sandwitching of a spacer made by TEFLON (a registered trademark) with 3 mm in thickness between the above two pieces of a laminate-reinforcement glass plate.

Epoxy resin composition (C1) was poured into the above mold, the mold was fixed with clamps, and then, curing was carried out for 6 hours at 120° C. after pre-curing for 2 hours at 80° C.

Finally, a cured substance with 3 mm in thickness was obtained by taking out from the mold.

The cured substance obtained was annealed for 6 hours at 180° C. and was maintained at 25° C. for more than 24 hours.

A test piece of 30 mm in length×30 mm in width×3 mm in thickness was prepared by cutting of the cured substance obtained, and an evaluation of dielectric constant was carried out.

An evaluation result is shown in Table 3.

TABLE 3

| | | | Example | | | | | | | | |
|---|---|---|---|---|---|---|---|---|---|---|---|
| | | | 12 | 13 | 14 | 15 | 16 | 17 | 18 | 19 | 20 |
| Epoxy resin composition | | | C1 | C2 | C3 | C4 | C5 | C6 | C7 | C8 | C9 |
| Blending (part) | Epoxy resin | Bis A | 100 | 100 | 100 | 100 | 100 | 100 | 100 | 100 | 100 |
| | Curing agent | Acid anhydride A | 85 | 85 | 85 | 85 | 85 | 85 | 85 | 85 | 85 |
| | | Accelerator | 1 | 1 | 1 | 1 | 1 | 1 | 1 | 1 | 1 |
| | Vinyl polymer powder | P1 | 10 | — | — | — | — | — | — | — | — |
| | | P2 | — | 10 | — | — | — | — | — | — | — |
| | | P3 | — | — | 10 | — | — | — | — | — | — |
| | | P4 | — | — | — | 10 | — | — | — | — | — |
| | | P5 | — | — | — | — | 10 | — | — | — | — |
| | | P6 | — | — | — | — | — | 10 | — | — | — |
| | | P7 | — | — | — | — | — | — | 10 | — | — |
| | | P8 | — | — | — | — | — | — | — | 10 | — |
| | | P9 | — | — | — | — | — | — | — | — | 10 |
| | | P10 | — | — | — | — | — | — | — | — | — |
| | | P11 | — | — | — | — | — | — | — | — | — |
| | | P12 | — | — | — | — | — | — | — | — | — |
| | | P13 | — | — | — | — | — | — | — | — | — |
| | | P14 | — | — | — | — | — | — | — | — | — |
| | | P15 | — | — | — | — | — | — | — | — | — |
| | | P16 | — | — | — | — | — | — | — | — | — |
| Evaluation of epoxy resin composition | Initial viscosity (mPa · s) | | 3400 | 3300 | 3000 | 3350 | 3300 | 3270 | 3200 | 3800 | 3700 |
| | Dispersibility (μm) | | <1 | <1 | <1 | <1 | <1 | <1 | <1 | <1 | 7 |
| | | | A | A | A | A | A | A | A | A | B |
| | Gelation temperature (° C.) | | 76 | 84 | 80 | 84 | 83 | 82 | 90 | 112 | 80 |
| | | | A | A | A | A | A | A | A | A | A |
| | Curing temperature (° C.) | | — | — | — | — | — | — | — | — | — |
| | Elastic modulus $G'_A$ (Pa) (gelation temperature − 20)° C. | | 7.07E−03 | 6.12E−03 | 7.20E−03 | 5.28E−03 | 2.60E−04 | 3.80E−03 | 2.41E−02 | 1.23E−03 | 8.30E−02 |
| | Arrival elastic modulus $G'_B$ (Pa) (gelation temperature + 20)° C. | | 8.13E+00 | 6.81E+00 | 6.32E+00 | 6.93E+00 | 6.98E−02 | 4.94E+00 | 5.08E+01 | — | 6.75E+00 |
| | $G'_B/G'_A$ | Ratio of elastic modulus | +1150 | +1110 | +880 | +1310 | +270 | +1300 | +2110 | — | +81 |
| | | | A | A | B | A | B | A | A | | C |
| | Storage stability | Thickening ratio (%) | +91 | +33 | +52 | +30 | +240 | +240 | +87 | +47 | +230 |
| | | $R_A/R_B$ | 91 | 33 | 52 | 30 | 240 | 240 | 87 | 47 | 230 |
| | | | B | B | B | B | C | C | B | B | C |
| Evaluation of cured substance | Curing condition | Film for curing | PET | PET | PET | PET | PET | PET | PET | PET | PET |
| | | Pre-curing (° C.) × (h) | 80 × 2 | 80 × 2 | 80 × 2 | 80 × 2 | 80 × 2 | 80 × 2 | 80 × 2 | 80 × 2 | 80 × 2 |
| | | Curing (° C.) × (h) | 120 × 6 | 120 × 6 | 120 × 6 | 120 × 6 | 120 × 6 | 120 × 6 | 120 × 6 | 120 × 6 | 120 × 6 |
| | Dielectric constant | (—) | 3.05 | 3.04 | 3.03 | 3.02 | 3.05 | 3.02 | 3.03 | 3.03 | 3.05 |
| | | (%) | +0.99 | +0.66 | +0.33 | 0 | +0.99 | 0 | +0.33 | +0.33 | +0.99 |
| | | | A | A | A | A | A | A | A | A | A |

| | | | Example | | Comparative example | | | | | |
|---|---|---|---|---|---|---|---|---|---|---|
| | | | 21 | 22 | 6 | 7 | 8 | 9 | 10 | 11 |
| Epoxy resin composition | | | C10 | C11 | C12 | C13 | C14 | C15 | C16 | C17 |
| Blending (part) | Epoxy resin | Bis A | 100 | 100 | 100 | 100 | 100 | 100 | 100 | 100 |
| | Curing agent | Acid anhydride A | 85 | 85 | 85 | 85 | 85 | 85 | 85 | 85 |
| | | Accelerator | 1 | 1 | 1 | 1 | 1 | 1 | 1 | 1 |
| | Vinyl polymer powder | P1 | — | — | — | — | — | — | — | — |
| | | P2 | — | — | — | — | — | — | — | — |
| | | P3 | — | — | — | — | — | — | — | — |
| | | P4 | — | — | — | — | — | — | — | — |
| | | P5 | — | — | — | — | — | — | — | — |

TABLE 3-continued

| | | | | | | | | | | |
|---|---|---|---|---|---|---|---|---|---|---|
| | | P6 | — | — | — | — | — | — | — | — |
| | | P7 | — | — | — | — | — | — | — | — |
| | | P8 | — | — | — | — | — | — | — | — |
| | | P9 | — | — | — | — | — | — | — | — |
| | | P10 | 10 | — | — | — | — | — | — | — |
| | | P11 | — | 10 | — | — | — | — | — | — |
| | | P12 | — | — | 10 | — | — | — | — | — |
| | | P13 | — | — | — | 10 | — | — | — | — |
| | | P14 | — | — | — | — | 10 | — | — | — |
| | | P15 | — | — | — | — | — | 10 | — | — |
| | | P16 | — | — | — | — | — | — | 10 | — |
| Evaluation of epoxy resin composition | Initial viscosity (mPa · s) | | 3850 | 2800 | 3340 | 4400 | 2580 | 2680 | 3200 | 2200 |
| | Dispersibility (μm) | | 18 | 3 | <1 | 28 | <1 | <1 | 20 | — |
| | | | C | B | A | D | A | A | C | |
| | Gelation temperature (° C.) | | 76 | 84 | 85 | 76 | 82 | Not gelated | 98 | Not gelated |
| | | | A | A | A | A | A | D | A | D |
| | Curing temperature (° C.) | | — | — | — | — | — | — | — | 115 |
| | Elastic modulus G'$_A$ (Pa) (gelation temperature − 20) ° C. | | 8.40E−02 | 6.80E−03 | 2.93E−05 | 1.40E−01 | 1.20E−04 | — | 7.20E−03 | — |
| | Arrival elastic modulus G'$_B$ (Pa) (gelation temperature + 20) ° C. | | 6.81E+00 | 1.19E+00 | 1.57E−02 | 6.54E+00 | 3.80E−04 | — | 2.90E−02 | — |
| | G'$_B$/G'$_A$ | Ratio of elastic modulus | +81 | +175 | +540 | +47 | +3.2 | Not gelated | +4.0 | Not gelated |
| | | | C | B | B | C | D | D | D | D |
| | Storage stability | Thickening ratio (%) | +230 | +170 | +100 | +250 | +30 | +30 | +1 | +1 |
| | | $R_A/R_B$ | 230 | 170 | 100 | 250 | 30 | 30 | 1 | |
| | | | C | C | B | C | B | B | A | |
| Evaluation of cured substance | Curing condition | Film for curing | PET | PET | PET | PET | PET | PET | PET | PET |
| | | Pre-curing (° C.) × (h) | 80 × 2 | 80 × 2 | 80 × 2 | 80 × 2 | 80 × 2 | 80 × 2 | 80 × 2 | 80 × 2 |
| | | Curing (° C.) × (h) | 120 × 6 | 120 × 6 | 120 × 6 | 120 × 6 | 120 × 6 | 120 × 6 | 120 × 6 | 120 × 6 |
| | Dielectric constant | (—) | 3.05 | 3.03 | 3.14 | 3.06 | 3.03 | 3.04 | 3.32 | 3.02 |
| | | (%) | +0.99 | +0.33 | +3.97 | +1.32 | +0.33 | +0.66 | +9.93 | |
| | | | A | A | D | B | A | A | D | |

Example 13 to 22, Comparative Example 6 to 11

Epoxy resin compositions (C2) to (C17) shown in Table 3 were used instead of epoxy resin composition (C1).

Except use of the above epoxy resin compositions, evaluations of epoxy resin compositions (C2) to (C17) were carried out in the same manner as in Example 12.

In addition, preparation of cured substances and evaluations were carried out in the same manner as in Example 12 except that epoxy resin compositions (C2) to (C17) were used instead of epoxy resin composition (C1).

Evaluation results are shown in Table 3.

Example 23

Primary kneading was carried out with the use of 100 parts of a bisphenol A type epoxy resin ("Epicoat 828" (Trade name) made in Japan epoxy resin Co., Ltd.) and 10 parts of vinyl polymer powder (P2) shown in Table 4.

Then, secondary kneading was carried out by addition of 2 parts of an accelerator (2-ethyl-4-methyl imidazole made in Shikoku Chemicals Corporation).

Except the above kneadings, epoxy resin composition (C18) was obtained in the same manner as in Example 12.

An evaluation was carried out in the same manner as in Example 12. An evaluation result is shown in Table 4.

Then, a cured substance was prepared in the same manner as in Example 12 except that a polyimide film (made in Ube Industries, Ltd., Trade name: UPILEX 12.5SN) was used instead of the PET film, and curing condition was changed to curing for 5 hours at 175° C.

Evaluation of dielectric constant was carried out with the use of the cured substance obtained in the same manner as in Example 12.

An evaluation result is shown in Table 4.

Comparative Example 12

As shown in Table 4, there was used epoxy resin composition (C19) which was obtained in the same manner as in Example 23 except without use of vinyl polymer powder (P2).

Except the above use of the epoxy resin composition, evaluation was carried out in the same manner as in Example 23.

In addition, a cured substance was prepared in the same manner as in Example 23.

An evaluation result is shown in Table 4.

TABLE 4

| | | | | Example 23 | Comparative example 12 |
|---|---|---|---|---|---|
| Epoxy resin composition | | | | C18 | C19 |
| Blending (part) | Epoxy resin | Bis A | | 100 | 100 |
| | Accelerator | | | 2 | 2 |
| | Vinyl polymer powder | | P2 | 10 | — |

TABLE 4-continued

| Epoxy resin composition | | Example 23 C18 | Comparative example 12 C19 |
|---|---|---|---|
| Evaluation of epoxy resin composition | Initial viscosity (mPa · s) | 32000 | 22000 |
| | Dispersibility (μm) | <1<br>A | — |
| | Gelation temperature (° C.) | 95<br>A | Not gelated<br>D |
| | Curing temperature (° C.) | — | 113 |
| | Elastic modulus $G'_A$ (Pa)<br>(gelation temperature − 20)° C. | 2.00E−04 | — |
| | Arrival elastic modulus $G'_B$ (Pa)<br>(gelation temperature + 20)° C. | 5.17E−01 | — |
| | $G'_B/G'_A$   Ratio of elastic modulus | +2590<br>A | Not gelated<br>D |
| | Storage stability   Thickening ratio (%) | +130 | +76 |
| | $R_A/R_B$ | 1.71<br>A | |
| Evaluation of cured substance | Curing condition   Film for curing | Polyimide | Polyimide |
| | Pre-curing (° C.) × (h) | — | — |
| | Curing (° C.) × (h) | 175 × 5 | 175 × 5 |
| | Dielectric constant (—) | 3.17 | 3.14 |
| | (%) | +0.96<br>A | |

Example 24

Primary kneading was carried out with the use of 100 parts of a bisphenol A type epoxy resin ("Epicoat 828" (Trade name) made in Japan epoxy resin Co., Ltd.) and 10 parts of vinyl polymer powder (P2) shown in Table 5.

Then, secondary kneading was carried out by addition of 49 parts of a curing agent (Acid anhydride type curing agent, "KAYAHARD MCD" (Trade name) made in Nippon Kayaku Co., Ltd.) and 1.25 parts of an accelerator (2-ethyl-4-methyl imidazole made in Shikoku Chemicals Corporation).

Except the above kneadings, epoxy resin composition (C20) was obtained in the same manner as in Example 12.

An evaluation was carried out in the same manner as in Example 12.

An evaluation result is shown in Table 5.

Then, a cured substance was prepared with the use of epoxy resin composition (C20) in the same manner as in Example 12.

Evaluation of dielectric constant was carried out with the use of the cured substance obtained in the same manner as in Example 12.

An evaluation result is shown in Table 5.

Comparative Example 13

As shown in Table 5, there was used epoxy resin composition (C21) which was obtained in the same manner as in Example 24 except without use of vinyl polymer powder (P2).

Except the above use of the epoxy resin composition, evaluation was carried out in the same manner as in Example 24.

In addition, a cured substance was prepared in the same manner as in Example 24.

An evaluation result is shown in Table 5.

TABLE 5

| Epoxy resin composition | | | Example 24 C20 | Comparative example 13 C21 |
|---|---|---|---|---|
| Blending (part) | Epoxy resin | Bis A | 100 | 100 |
| | Curig agent | Acid anhydride B | 49 | 49 |
| | Accelerator | | 1.25 | 1.25 |
| | Vinyl polymer powder | P2 | 10 | — |
| Evaluation of epoxy resin composition | Initial viscosity (mPa · s) | | 13400 | 12900 |
| | Dispersibility (μm) | | <1<br>A | — |
| | Gelation temperature (° C.) | | 90<br>A | Not gelated<br>D |
| | Curing temperature (° C.) | | — | 128 |
| | Elastic modulus $G'_A$ (Pa)<br>(gelation temperature − 20)° C. | | 3.20E−04 | — |
| | Arrival elastic modulus $G'_B$ (Pa)<br>(gelation temperature + 20)° C. | | 4.17E−02 | — |
| | $G'_B/G'_A$ | Ratio of elastic modulus | +130<br>B | Not gelated<br>D |
| | Storage stability | Thickening ratio (%) | +64 | +15 |
| | | $R_A/R_B$ | 4.27<br>A | |
| Evaluation of cured substance | Curing condition | Film for curing | PET | PET |
| | | Pre-curing (° C.) × (h) | 80 × 2 | 80 × 2 |
| | | Curing (° C.) × (h) | 120 × 6 | 120 × 6 |

TABLE 5-continued

|  | | Example 24 C20 | Comparative example 13 C21 |
|---|---|---|---|
| Epoxy resin composition | | | |
| Dielectric constant | (—) | 3.21 | 3.18 |
|  | (%) | +0.94 | |
|  |  | A | |

Example 25

Primary kneading was carried out with the use of 100 parts of a bisphenol A type epoxy resin ("Epicoat 828" (Trade name) made in Japan epoxy resin Co., Ltd.) and 10 parts of vinyl polymer powder (P2) shown in Table 6.

Then, secondary kneading was carried out by addition of 25 parts of a curing agent (Amine type curing agent, "jERCURE W" (Trade name) made in Japan epoxy resin Co., Ltd.).

Except the above kneadings, epoxy resin composition (C22) was obtained in the same manner as in Example 12.

An evaluation was carried out in the same manner as in Example 12.

An evaluation result is shown in Table 6.

Then, a cured substance was prepared in the same manner as in Example 23 except that curing for 4 hours at 175° C. was carried out after pre-curing for 2 hours at 100° C.

Evaluation of dielectric constant was carried out with the use of the cured substance obtained in the same manner as in Example 12.

An evaluation result is shown in Table 6.

Comparative Example 14

As shown in Table 6, there was used epoxy resin composition (C23) which was obtained in the same manner as in Example 25 except without use of vinyl polymer powder (P2).

Except the above use of the epoxy resin composition, evaluation was carried out in the same manner as in Example 25.

In addition, a cured substance was prepared in the same manner as in Example 25.

An evaluation result is shown in Table 6.

TABLE 6

| | | | Example 25 C22 | Comparative example 14 C23 |
|---|---|---|---|---|
| | Epoxy resin composition | | | |
| Blending (part) | Epoxy resin | Bis A | 100 | 100 |
| | Curig agent | Amine type | 25 | 25 |
| | Vinyl polymer powder | P2 | 10 | — |
| Evaluation of epoxy resin composition | Initial viscosity (mPa · s) | | 10500 | 10000 |
| | Dispersibility (μm) | | <1 | — |
| | | | A | |
| | Gelation temperature (° C.) | | 86 | Not gelated |
| | | | B | D |
| | Curing temperature (° C.) | | — | 192 |
| | Elastic modulus $G'_A$ (Pa) (gelation temperature − 20)° C. | | 8.90E−04 | — |
| | Arrival elastic modulus $G'_B$ (Pa) (gelation temperature + 20)° C. | | 7.68E−02 | — |
| | $G'_B/G'_A$ | Ratio of elastic modulus | +90 | Not gelated |
| | | | C | D |
| | Storage stability | Thickening ratio (%) | +76 | +41 |
| | | $R_A/R_B$ | 1.85 | |
| | | | A | |
| Evaluation of cured substance | Curing condition | Film for curing | Polyimide | Polyimide |
| | | Pre-curing (° C.) × (h) | 100 × 2 | 100 × 2 |
| | | Curing (° C.) × (h) | 175 × 4 | 175 × 4 |
| | Dielectric constant | (—) | 3.43 | 3.4 |
| | | (%) | +0.88 | |
| | | | A | |

Example 26

Primary kneading was carried out with the use of 100 parts of a bisphenol F type epoxy resin ("RE303S-L" (Trade name) made in Nippon Kayaku Co., Ltd.) and 10 parts of vinyl polymer powder (P2) shown in Table 7.

Then, secondary kneading was carried out by addition of 94 parts of a curing agent (Acid anhydride type curing agent, "RICACID MH-700" (Trade name) made in New Japan Chemical Co., Ltd.) and 1.1 parts of an accelerator (2-ethyl-4-methyl imidazole made in Shikoku Chemicals Corporation).

Except the above kneadings, epoxy resin composition (C24) was obtained in the same manner as in Example 12.

An evaluation was carried out in the same manner as in Example 12.

An evaluation result is shown in Table 7.

Then, a cured substance was prepared with the use of epoxy resin composition (C24) in the same manner as in Example 12

Evaluation of dielectric constant was carried out with the use of the cured substance obtained in the same manner as in Example 12.

An evaluation result is shown in Table 7.

Comparative Example 15

As shown in Table 7, there was used epoxy resin composition (C25) which was obtained in the same manner as in Example 26 except without use of vinyl polymer powder (P2).

Except the above use of the epoxy resin composition, evaluation was carried out in the same manner as in Example 26.

In addition, a cured substance was prepared in the same manner as in Example 26.

An evaluation result is shown in Table 7.

Except the above kneadings, epoxy resin composition (C26) was obtained in the same manner as in Example 12.

An evaluation was carried out in the same manner as in Example 12.

An evaluation result is shown in Table 8.

Then, a cured substance was prepared with the use of epoxy resin composition (C26) in the same manner as in Example 12.

Evaluation of dielectric constant was carried out with the use of the cured substance obtained in the same manner as in Example 12.

An evaluation result is shown in Table 8.

TABLE 7

| Epoxy resin composition | | | Example 26 C24 | Comparative example 15 C25 |
|---|---|---|---|---|
| Blending (part) | Epoxy resin | Bis F | 100 | 100 |
| | Curig agent | Acid anhydride A | 94 | 94 |
| | Accelerator | | 1.1 | 1.1 |
| | Vinyl polymer powder | P2 | 10 | — |
| Evaluation of epoxy resin composition | Initial viscosity (mPa · s) | | 1000 | 990 |
| | Dispersibility (μm) | | <1<br>A | — |
| | Gelation temperature (° C.) | | 80<br>A | Not gelated<br>D |
| | Curing temperature (° C.) | | — | 100 |
| | Elastic modulus G'$_A$ (Pa)<br>(gelation temperature − 20)° C. | | 8.30E−06 | — |
| | Arrival elastic modulus G'$_B$ (Pa)<br>(gelation temperature + 20)° C. | | 4.70E−03 | — |
| | G'$_B$/G'$_A$ | Ratio of elastic modulus | +570<br>B | Not gelated<br>D |
| | Storage stability | Thickening ratio (%)<br>R$_A$/R$_B$ | +110<br>110<br>C | +1 |
| Evaluation of cured substance | Curing condition | Film for curing | PET | PET |
| | | Pre-curing (° C.) × (h) | 80 × 2 | 80 × 2 |
| | | Curing (° C.) × (h) | 120 × 6 | 120 × 6 |
| | Dielectric constant | (—)<br>(%) | 3.11<br>+0.97<br>A | 3.08 |

Example 27

Primary kneading was carried out with the use of 100 parts of a biphenyl type epoxy resin ("NC3000" (Trade name) made in Nippon Kayaku Co., Ltd.), 57 parts of a curing agent (Acid anhydride type curing agent, "RICACID MH-700" (Trade name) made in New Japan Chemical Co., Ltd.) and 10 parts of vinyl polymer powder (P2) shown in Table 8.

Then, secondary kneading was carried out by addition of 0.68 parts of an accelerator (2-ethyl-4-methyl imidazole made in Shikoku Chemicals Corporation).

Comparative Example 16

As shown in Table 8, there was used epoxy resin composition (C27) which was obtained in the same manner as in Example 27 except without use of vinyl polymer powder (P2).

Except the above use of the epoxy resin composition, evaluation was carried out in the same manner as in Example 27.

In addition, a cured substance was prepared in the same manner as in Example 27.

An evaluation result is shown in Table 8.

TABLE 8

| Epoxy resin composition | | | Example 27 C26 | Comparative example 16 C27 |
|---|---|---|---|---|
| Blending (part) | Epoxy resin | Biphenyl type | 100 | 100 |
| | Curig agent | Acid anhydride A | 57 | 57 |
| | Accelerator | | 0.68 | 0.68 |
| | Vinyl polymer powder | P2 | 10 | — |
| Evaluation of epoxy | Initial viscosity (mPa · s) | | 28000 | 40000 |
| | Dispersibility (μm) | | <1 | — |

TABLE 8-continued

|  |  | Example 27 C26 | Comparative example 16 C27 |
|---|---|---|---|
| resin composition | Gelation temperature (° C.) | A 97 A | Not gelated D |
|  | Curing temperature (° C.) | — | 115 |
|  | Elastic modulus $G'_A$ (Pa) (gelation temperature − 20)° C. | 9.60E−04 | — |
|  | Arrival elastic modulus $G'_B$ (Pa) (gelation temperature + 20)° C. | 1.74E−02 | — |
|  | $G'_B/G'_A$   Ratio of elastic modulus | +20 C | Not gelated D |
|  | Storage    Thickening ratio (%) stability   $R_A/R_B$ | +650 23.2 B | +28 |
| Evaluation of cured substance | Curing condition | Film for curing Pre-curing (° C.) × (h) Curing (° C.) × (h) | PET 80 × 2 120 × 6 | PET 80 × 2 120 × 6 |
|  | Dielectric constant  (—) (%) | 3.03 +1.00 A | 3.00 |

Example 28

Primary kneading was carried out with the use of 100 parts of a naphthalene type epoxy resin ("HP4032" (Trade name) made in DIC Corporation), 105 parts of a curing agent (Acid anhydride type curing agent, "RICACID MH-700" (Trade name) made in New Japan Chemical Co., Ltd.) and 10 parts of vinyl polymer powder (P2) shown in Table 9.

Then, secondary kneading was carried out by addition of 1.55 parts of an accelerator (2-ethyl-4-methyl imidazole made in Shikoku Chemicals Corporation).

Except the above kneadings, epoxy resin composition (C28) was obtained in the same manner as in Example 12.

An evaluation was carried out in the same manner as in Example 12.

An evaluation result is shown in Table 9.

Then, a cured substance was prepared with the use of epoxy resin composition (C28) in the same manner as in Example 12.

Evaluation of dielectric constant was carried out with the use of the cured substance obtained in the same manner as in Example 12.

An evaluation result is shown in Table 9.

Comparative Example 17

As shown in Table 9, there was used epoxy resin composition (C29) which was obtained in the same manner as in Example 28 except without use of vinyl polymer powder (P2).

Except the above use of the epoxy resin composition, evaluation was carried out in the same manner as in Example 28.

In addition, a cured substance was prepared in the same manner as in Example 28.

An evaluation result is shown in Table 9.

TABLE 9

|  |  |  | Example 28 C28 | Comparative example 17 C29 |
|---|---|---|---|---|
| Blending (part) | Epoxy resin | Naphthalene type | 100 | 100 |
|  | Curig agent | Acid anhydride A | 105 | 105 |
|  | Accelerator |  | 1.55 | 1.55 |
|  | Vinyl polymer powder | P2 | 10 | — |
| Evaluation of epoxy resin composition | Initial viscosity (mPa · s) |  | 17600 | 3700 |
|  | Dispersibility (μm) |  | <1 A | — |
|  | Gelation temperature (° C.) |  | 80 A | Not gelated D |
|  | Curing temperature (° C.) |  | — | 127 |
|  | Elastic modulus $G'_A$ (Pa) (gelation temperature − 20)° C. |  | 1.50E−03 | — |
|  | Arrival elastic modulus $G'_B$ (Pa) (gelation temperature + 20)° C. |  | 1.11E−01 | — |
|  | $G'_B/G'_A$ Ratio of elastic modulus |  | +70 C | Not gelated D |
|  | Storage stability | Thickening ratio (%) $R_A/R_B$ | Cannot be applied E | +1 |

TABLE 9-continued

| Epoxy resin composition | | | Example 28 C28 | Comparative example 17 C29 |
|---|---|---|---|---|
| Evaluation of cured substance | Curing condition | Film for curing | PET | PET |
| | | Pre-curing (° C.) × (h) | 80 × 2 | 80 × 2 |
| | | Curing (° C.) × (h) | 120 × 6 | 120 × 6 |
| | Dielectric constant | (—) | 3.23 | 3.20 |
| | | (%) | +0.94 | |
| | | | A | |

It is apparent from results that acetone-soluble components of vinyl polymer powder (P1), (P5), and (P15) are more than 98%, 48%, and less than 5%, respectively.

The gelation temperature of epoxy resin composition (C1), (C5) and (C15), which are obtained by blending of these vinyl polymer powders, are 76° C., 83° C. and "Gelation did not occur.", respectively.

Gelation temperature lowers in order with decrease of the acetone-soluble component and it is recognized that gelation does not occur when the acetone-soluble component is less than 5%.

In addition, gelation performances ($G'_B/G'_A$), which are indicated by viscosity changes, of epoxy resin compositions (C1), (C5), and (C15) are +1,150, +270, and "Gelation did not occur.", respectively.

From the above fact, it is recognized that content of the acetone-soluble component in the vinyl polymer powder is predominant over gelation temperature and gelation performance.

In addition, vinyl polymer powder (P2) and (P14) have the same polymer composition, and vinyl polymer powder (P2) and (P14) have the acetone-soluble component of more than 98%.

However, Mw of the acetone-soluble component of vinyl polymer powder (P2) and (P14) are 757,000 and 82,000, respectively, and they are different greatly.

Both of arrival elastic modulus ($G'_B$) of epoxy resin composition (C2) and (C14) in which the above vinyl polymer powders are blended are 6.81 and $3.80 \times 10^{-4}$, and show lowering depending on molecular weight.

From the above fact, it is recognized that molecular weight of the acetone-soluble component of the vinyl polymer powder is predominant to degree of gelation.

Vinyl polymer powder (P2) and (P12) have the same polymer composition.

However, both of the content of alkali metal ion of vinyl polymer powder (P2) and (P12) are less than 1 ppm and 83.5 ppm, respectively, and they are different greatly.

Both of dielectric constant of the cured substance of epoxy resin composition (C2) and (C12) in which the above vinyl polymer powders are blended are 3.04 and 3.14, and show rising depending on content of the alkali metal ion.

In addition, the content of alkali metal ion of the vinyl polymer powder (P16) is 341 ppm and dielectric constant of the cured substance of epoxy resin composition (C16) in which vinyl polymer powder (P16) is blended is high with 3.32.

The above results show much decrease of electric characteristics, so that it is not suitable for fields of electronic materials.

Vinyl polymer powder (P3) is a material that a monomer composition for the second step polymerization of vinyl polymer powder (P2) is changed and the solubility parameter is lowered.

The gelation temperatures of epoxy resin composition (C2) and (C3) in which these vinyl polymer powders are blended are 84° C. and 80° C., and the one having lower solubility parameter shows faster melting rate. From the above fact, it is recognized that solubility parameter of the vinyl polymer powder affects gelation behavior.

Solubility parameter of the vinyl polymer powder can be obtained by well-known methods.

For example, it can be obtained with the use of the formula of Fedors and the formula of Hansen.

For vinyl polymer emulsions (L2), (L9), and (L12), polymer compositions are the same.

However, volume average primary particle sizes of vinyl polymer emulsions (L2), (L9), and (L12) are 764 nm, 335 nm, and 181 nm, respectively.

Evaluation of dispersibility by grindmeter of epoxy resin compositions (C2), (C9), and (C13) in which vinyl polymer powders (P2), (P9), and (P13), which are obtained by the above vinyl polymer emulsions, are blended are less than 1 μm, 7 μm, and 28 μm, respectively.

Dispersibility to primary particles of the vinyl polymer powders decrease by lowering of primary particle sizes of the vinyl polymers, and it is recognized that dispersibility to primary particles is more excellent as primary particle size of the vinyl polymer is bigger.

In addition, initial viscosities of epoxy resin compositions (C2), (C9), and (C13) in which vinyl polymer powders (P2), (P9), and (P13) are blended rise as 3,300, 3,700, and 4,400 sequentially, and storage stabilities grow as +33, +230, and +250.

As the above characteristics change, gelation performances ($G'_B/G'_A$) lower with +1,110, +81, and +47 in order.

From the above fact, it is recognized that primary particle size affects not only dispersibility but also initial viscosity, storage stability and gelation performance.

Vinyl polymer powders (P6) to (P8) which are different from other examples, are not particles obtained by two-step polymerization, and are vinyl polymers having uniform structures, which are obtained by only single step polymerization.

Gelation temperatures of epoxy resin compositions (C6) to (C8) in which vinyl polymer powders (P6) to (P8) are blended are 82° C., 90° C., and 112° C., respectively.

From the above fact, it recognized that a vinyl polymer with uniform structure having lower solubility parameter shows faster melting rate.

In other words, a gelation temperature can be changed by adjusting of a solubility parameter (by adjusting of quantity of methacrylic acid unit) and it is possible to select a gelation temperature depending on the application.

Epoxy resin composition (C8) has a high gelation temperature with 112° C., so that curing of the epoxy resin composition was initiated at "gelation temperature +20° C. (132° C.)" and arrival elastic modulus $G'_B$ was not be able to be measured.

Vinyl polymer powder (P4) is the one in which quantity of sulfate ion is reduced than quantity of sulfate ion of vinyl polymer powder (P2).

Dieletcric constant of epoxy resin composition (C4) in which vinyl polymer powder (P4) is blended is 3.02, and is lower than dielectric constant of 3.04 with epoxy resin composition (C2) in which vinyl polymer powder (P2) is blended.

Also, it is recognized that dielectric constant of epoxy resin composition (C4) is equal to dielectric constant of epoxy resin composition (C17) which does not comprise a vinyl polymer powder.

From the above fact, it is recognized that electric characteristics of the cured substance of the epoxy resin comprising the vinyl polymer powder becomes to be satisfied and the above epoxy resin composition becomes to be suitable for fields of electronic materials, by exclusion of an alkali metal ion and reduction as possible of sulfate ion in the vinyl polymer powder.

Vinyl polymer powder (P10) is obtained by spray-drying of a mixture of 50% of vinyl polymer emulsion (L2) and 50% of vinyl polymer emulsion (L12), has wide particle size distribution of 2.50, and has bimodality.

Dispersibility by grindmeter of epoxy resin composition (C10) in which vinyl polymer powder (P10) is blended is 18 μm.

Thus, when particle size distribution is wide, coagulation powder coming from a vinyl polymer with small particle sizes cannot disperse satisfactorily and it remains as a granular structure, so that correspondence to finer pitch is unsuitable.

In addition, particle size distribution of the vinyl polymer powders (P2), (P10), and (P12) are 1.18, 2.50, and 1.19, respectively.

Also, gelation performance ($G'_B/G'_A$) of epoxy resin compositions (C2), (C10), and (C12) in which the above vinyl polymer powders are blended are +1,110, +81, and +540, respectively.

From the above fact, it is recognized that gelation performance is reduced when particle size distribution becomes wide.

Vinyl polymer powder (P11) is a material that was obtained by a micro suspension polymerization, and has particle size of 2 μm or more.

Dispersibility by grindmeter of epoxy resin composition (C11) in which vinyl polymer powder (P11) is blended is 3 μm.

In this case, vinyl polymer powder (P11) disperses in a level of primary particles.

However, it is possible that the above dispersibility of primary particles may be considered as a granular structure in a recent field of finer pitch.

As is apparent from results, epoxy resin compositions (C18), (C20), (C22), (C24), (C26), and (C28) in which vinyl polymer powder (P2) are blended have excellent dispersibility of vinyl polymer powder (P2) and gelation performance even when compositions with the use of a variety of epoxy resin with a curing agent and an accelerator are used.

The present application insists on priority on the basis of Japanese Patent Application No. 2009-024,751 and Japanese Patent Application No. 2009-193,366, and the subject matters include all matters included in these basic applications.

INDUSTRIAL APPLICABILITY

The vinyl polymer powder of the present invention is excellent in mutual dispersibility with a curable resin which is especially an epoxy resin, and makes the curable resin composition gelate immediately by short-time heating with predetermined temperature.

Also, the vinyl polymer powder of the present invention has low ion concentration, so that the vinyl polymer powder of the present invention can be used as a pre-gel agent for electronic parts achieving superior electrical characteristics.

The vinyl polymer powder of the present invention can be used for various applications such as primary-mounting under-filling materials; secondary-mounting under-filling materials; fluidal sealants like glove-top materials in wire bonding, sealing sheets to seal various tips on a board in lump-sum; pre-dispensing type under-filling materials; sealing sheets for sealing with a wafer level in a lump; adhesion layers for three-layer copper-clad laminate; adhesion layers like die bonding films, diagram-touching films, layer insulation films and cover-lay films; adherent pastes like die bond pastes, layer insulation pastes, conductive pastes and anisotropic conductive pastes; sealants of light-emitting diode; optical adhesives; and sealing materials of various flat panel displays like a crystalline liquid and an organic electroluminescence.

The invention claimed is:

1. A curable resin composition, comprising:
   1 to 30% by mass of a vinyl polymer powder; and
   70 to 99% by mass of a curable resin;
   wherein the vinyl polymer powder comprises a primary particle having a core shell morphology wherein at least one of a solubility parameter and molecular weight is different for the core and the shell of the primary particle,
   an acetone-soluble component of the vinyl polymer powder is 30% by mass or more,
   a mass average molecular weight of the acetone-soluble component is 100,000 or more,
   a content of an alkali metal ion of the vinyl polymer powder is 10 ppm or less,
   a volume average particle size (Dv) of the primary particle is from 500 nm to 830 nm, and
   the curable resin is an epoxy resin which is liquid at 25° C.

2. A cured substance obtained by curing of the curable resin composition according to claim 1.

3. A sealing material for a semiconductor, comprising in a cured form, the curable resin composition according to claim 1.

4. A sheet product, comprising in a cured form, the curable resin composition according to claim 1.

5. The vinyl polymer powder according to claim 1, wherein a sulfate ion ($SO_4^{2-}$) content is 20 ppm or less.

6. The vinyl polymer powder according to claim 1, wherein a ratio ($D_v/D_n$) of the volume average primary particle size ($D_v$) to a number average primary particle size ($D_n$) is 3.0 or less.

* * * * *